US 7,666,722 B2

(12) United States Patent
Koyama

(10) Patent No.: US 7,666,722 B2
(45) Date of Patent: Feb. 23, 2010

(54) MANUFACTURING METHOD OF SEMICONDUCTOR DEVICE, AND IC CARD, IC TAG, RFID, TRANSPONDER, BILL, SECURITIES, PASSPORT, ELECTRONIC APPARATUS, BAG, AND GARMENT

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 437 days.

(21) Appl. No.: 10/588,989

(22) PCT Filed: Feb. 15, 2005

(86) PCT No.: PCT/JP2005/002680

§ 371 (c)(1),
(2), (4) Date: Aug. 10, 2006

(87) PCT Pub. No.: WO2005/081307

PCT Pub. Date: Sep. 1, 2005

(65) Prior Publication Data

US 2007/0184670 A1    Aug. 9, 2007

(30) Foreign Application Priority Data

Feb. 20, 2004   (JP)  ............................. 2004-045480

(51) Int. Cl.
*H01L 21/00*    (2006.01)
(52) U.S. Cl. ................................. 438/155; 257/E21.689
(58) Field of Classification Search ................. 438/155, 438/946, 211; 257/E21.689
See application file for complete search history.

(56) References Cited

U.S. PATENT DOCUMENTS

| 5,604,143 | A  |   | 2/1997  | Ishida et al. |
| 6,525,595 | B2 |   | 2/2003  | Oku |
| 6,617,172 | B2 | * | 9/2003  | Usami ............................ 438/2 |
| 2001/0046730 | A1 |   | 11/2001 | Suzuki et al. |
| 2002/0074666 | A1 |   | 6/2002  | Usami |
| 2003/0024635 | A1 |   | 2/2003  | Utsunomiya |
| 2003/0104659 | A1 |   | 6/2003  | Arakawa et al. |

FOREIGN PATENT DOCUMENTS

| EP | 0 712 136  | 5/1996 |
| JP | 11-026357  | 1/1999 |

OTHER PUBLICATIONS

International Search Report (Application No. PCT/JP2005/002680) dated May 31, 2005.
Written Opinion (Application No. PCT/JP2005/002680) dated May 31, 2005.
Office Action (Application No. 200580005359.7) Dated Mar. 13, 2009.

* cited by examiner

*Primary Examiner*—Chandra Chaudhari
(74) *Attorney, Agent, or Firm*—Eric J. Robinson; Robinson Intellectual Property Law Office, P.C.

(57) ABSTRACT

The present invention provides a manufacturing method of a semiconductor device used as an ID chip, by which data can be written with improved throughput. According to the manufacturing method of a semiconductor device having a modulation circuit, a demodulation circuit, a logic circuit, a memory circuit, and an antenna circuit over an insulating substrate, the memory circuit is a nonvolatile memory circuit of which data is written in the manufacture of the semiconductor device, and elements in a data portion are formed by electron beam exposure or laser exposure while the other portions are formed by mirror projection exposure, step and repeat exposure, or step and scan exposure.

15 Claims, 26 Drawing Sheets

FIG. 1A  resist application, baking or the like

FIG. 1B  exposing common part by first exposure means
(mirror projection exposure,
step and repeat exposure,
step and scan exposure or the like)

FIG. 1C  exposing data portion of memory circuit
by second exposure means
(electron beam exposure,
laser exposure or the like)

FIG. 1D  development, baking or the like

FIG. 1E  forming contact hole by etching

FIG. 9A — resist application, baking or the like

FIG. 9B — exposing common part by first exposure means
(mirror projection exposure,
step and repeat exposure,
step and scan exposure or the like)

FIG. 9C — development, baking or the like

FIG. 9D — forming common part by etching

FIG. 9E — resist application, baking or the like

FIG. 9F — exposing data portion of memory circuit
by second exposure means
(elecron beam exposure, laser exposure or the like)

FIG. 9G — development, baking or the like

FIG. 9H — forming data portion by etching

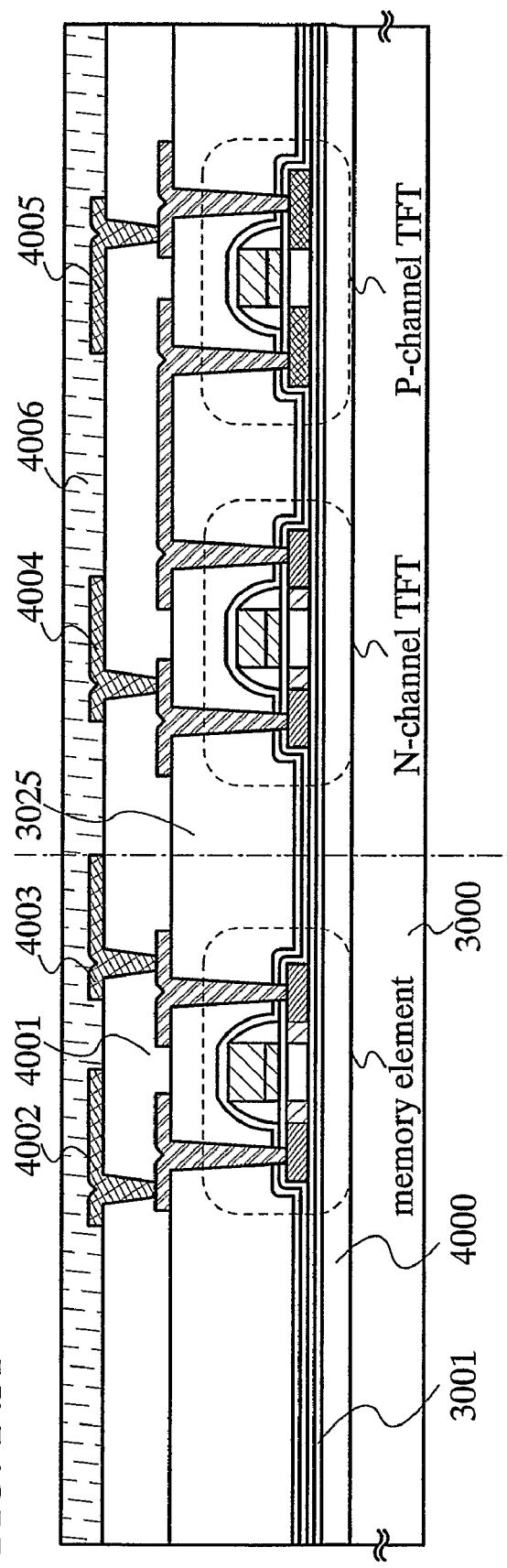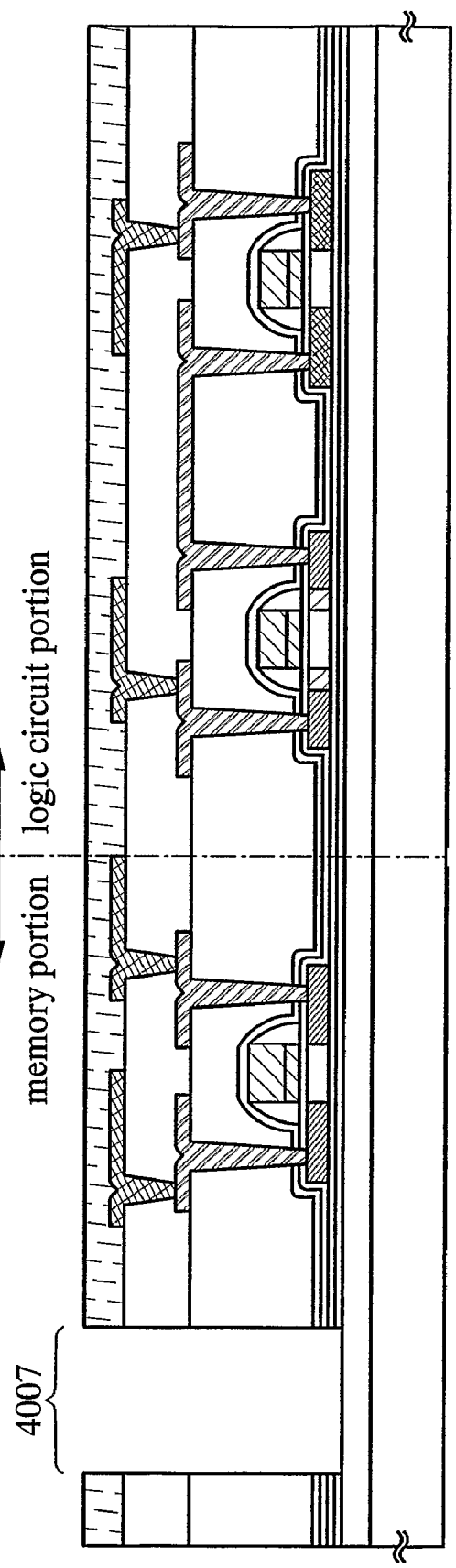

MANUFACTURING METHOD OF SEMICONDUCTOR DEVICE, AND IC CARD, IC TAG, RFID, TRANSPONDER, BILL, SECURITIES, PASSPORT, ELECTRONIC APPARATUS, BAG, AND GARMENT

TECHNICAL FIELD

The present invention relates to a manufacturing method of a semiconductor device used as an IC chip (hereinafter also referred to as an ID chip) capable of storing needed data in a memory circuit or reading data by a contactless means such as wireless communication. In particular, the invention relates to a manufacturing method of a semiconductor device used as an ID chip formed over an insulating substrate such as a glass or plastic substrate.

BACKGROUND ART

With the development of computer technologies and the improvement of image recognition technologies, data identification utilizing media such as bar codes has been widely used for identification of product data and the like. It is expected that the amount of data to be identified will be further increased in the future. On the other hand, data identification utilizing bar codes is disadvantageous in that a bar code reader is required to be in contact with bar codes, and the amount of data stored in bar codes cannot be increased so much. Therefore, contactless data identification and increase in the storage capacity of media are required.

In view of the foregoing, an ID chip using an IC has been developed in recent years. According to the ID chip, required data is stored in a memory circuit of an IC chip and the data is read by a contactless means, generally by a wireless means. It is expected that practical application of such an ID chip allows commercial distribution and the like to be simplified and reduced in cost while maintaining high security.

An identification system using an ID chip is briefly described with reference to FIG. 4. FIG. 4 is a schematic view showing an identification system for obtaining identification data of a bag by wireless. An ID chip 401 storing specific identification data is mounted on or incorporated in a bag 404. Electromagnetic waves are transmitted from an antenna unit 402 of an interrogator (also called a reader/writer) 403 to the ID chip 401. Receiving the electromagnetic waves, the ID chip 401 sends its identification data back to the antenna unit 402. The antenna unit 402 transmits the received identification data to the interrogator 403, and the interrogator 403 determines the identification data. In this manner, the interrogator 403 can obtain the data of the bag 404. Such a system enables distribution management, tabulation, prevention of counterfeit goods, and the like.

The ID chip has, for example, a configuration shown in FIG. 2. A semiconductor device 200 used as an ID chip includes an antenna circuit 201, a rectification circuit 202, a stabilizing power supply circuit 203, an amplifier 208, a demodulation circuit 213, a logic circuit 209, a memory control circuit 212, a memory circuit 211, a logic circuit 207, an amplifier 206, and a modulation circuit 205. The antenna circuit 201 includes an antenna coil 301 and a tuning capacitor 302 (FIG. 3A). The rectification circuit 202 includes diodes 303 and 304, and a smoothing capacitor 305 (FIG. 3B).

The operation of such an ID chip is described hereinafter. An AC signal received by the antenna circuit 201 is half-wave rectified by the diodes 303 and 304, and then smoothed by the smoothing capacitor 305. The smoothed voltage, which has many ripples, is stabilized by the stabilizing power supply circuit 203, and the stabilized voltage is supplied to the modulation circuit 205, the demodulation circuit 213, the amplifier 206, the logic circuit 207, the amplifier 208, the logic circuit 209, the memory circuit 211, and the memory control circuit 212. Meanwhile, a signal received by the antenna circuit 201 is inputted as a clock signal to the logic circuit 209 through the amplifier 208. A signal inputted from the antenna coil 301 is demodulated by the demodulation circuit 213, and inputted as data to the logic circuit 209.

The data inputted to the logic circuit 209 is decoded. Since the interrogator encodes data by deformable mirror code, NRZ-L code or the like, the logic circuit 209 decodes the data. The decoded data is transmitted to the memory control circuit 212, thereby memory data stored in the memory circuit 211 is read. The memory circuit 211 is required to be a nonvolatile memory circuit such as a mask ROM, which is capable of holding data even when a power supply is turned off. The memory circuit 211 stores, for example, 16-byte data having 4-byte family code representing the ID chip sequence, 4-byte application code, and two kinds of 4-byte user codes set by users (see FIG. 12).

The frequency of a transmitted and received signal is 125 kHz, 13.56 MHz, 915 MHz, or 2.45 GHz each having an ISO standard and the like. In addition, modulation and demodulation systems for transmitting and receiving signals are also standardized. An example of such an ID chip is disclosed in Patent Document 1. [Patent Document 1] Japanese Patent Laid-Open No. 2001-250393

The aforementioned conventional semiconductor device for an ID chip has the following problems. If a mask ROM is used as a memory circuit, data cannot be written except in the manufacture of a chip. Thus, data that is different for each chip is required to be written in the manufacture of the chip. When such a chip is manufactured, each chip pattern is formed by electron beam exposure. The electron beam exposure has poor throughput while increased flexibility of exposure.

In general, the following method is adopted for manufacturing the same chip in large quantities. FIG. 5 shows a schematic view of a mirror projection exposure system. The mirror projection exposure system includes a concave mirror 501, a convex mirror 502, a reticle 503, a substrate 504, a slit 505, and a light source 506. The slit 505 limits the area where light from the light source 506 can pass. The light passing the slit 505 passes the reticle 503, and after being reflected by the concave mirror 501 and the convex mirror 502, it is irradiated to the substrate 504. By moving the reticle 503 and the substrate 504, a pattern on the reticle 503 is exposed on the substrate 504. In FIG. 5, the reticle 503 moves from right to left while the substrate 504 moves from left to right. If the same chip is drawn on the reticle 503 in large quantities, the same pattern can be transferred onto the substrate 504.

FIG. 6 shows a schematic view of a step and scan exposure system. The step and scan exposure system includes a stage 601, a substrate 602, an optical system 603, a reticle 604, an optical system 605, a slit 606, an optical system 607, and a light source 608. Light from the light source 608 is irradiated to the slit 606 through the optical system 607, and the slit 606 limits the area where the light passes. Then, the light is irradiated to the reticle 604 through the optical system 605. The light passing the reticle 604 is irradiated to the substrate 602 through the optical system 603. The substrate 602 as well as the stage 601 moves in the same direction as the reticle 604 (from left to right in FIG. 6). Accordingly, a pattern on the reticle 604 is transferred onto the substrate 602. The step and scan exposure system allows a large-area exposure with high definition.

The aforementioned mirror projection exposure and step and scan exposure, a step and repeat exposure (stepper exposure) that is not yet described, and the like are advantageous in forming the same pattern. However, chips each including different data as described above are difficult to be formed by these exposure systems.

Meanwhile, if an EEPROM is used as a memory circuit, user can rewrite data freely after the manufacture of a chip. However, at the same time, anyone other than the user can change data for identification that should not be rewritten, which allows counterfeiting. Thus, an ID chip of which counterfeiting is impossible is required.

DISCLOSURE OF INVENTION

In view of the foregoing, the invention provides a manufacturing method of a semiconductor device used as an ID chip, which has improved throughput and prevents counterfeiting.

The invention comprises the step of forming a semiconductor device including a modulation circuit, a demodulation circuit and a logic circuit over an insulating substrate by a first exposure means, and the step of forming a plurality of different memory circuits over the same substrate by a second exposure means.

The invention comprises the step of applying a photoresist on an insulating substrate, a first exposure step of exposing the photoresist by a first exposure means to pattern a plurality of semiconductor devices each including a modulation circuit, a demodulation circuit and a logic circuit, a second exposure step of exposing the photoresist by a second exposure means to pattern a plurality of different memory circuits, and the step of developing the photoresist exposed by the first and second exposure steps and then etching.

According to the aforementioned invention, the memory circuit is a mask ROM.

According to the aforementioned invention, the difference among the plurality of memory circuits is data stored therein.

According to the aforementioned invention, the second exposure means can change the contents of exposure depending on program.

According to the aforementioned invention, the first exposure means is an exposure means using a mirror projection exposure system.

According to the aforementioned invention, the first exposure means is an exposure means using a step and repeat exposure system.

According to the aforementioned invention, the first exposure means is an exposure means using a step and scan exposure system.

According to the aforementioned invention, the second exposure means is an exposure means using an electron beam exposure system.

According to the aforementioned invention, the second exposure means is an exposure means using a laser exposure system.

According to the aforementioned invention, a portion exposed by the second exposure means is a contact hole.

According to the aforementioned invention, the insulating substrate is the one selected from a glass substrate, a plastic substrate or a film insulator.

In the invention, an ID chip means a semiconductor chip used for identification, which is used as an IC tag, a wireless tag, an RFID, an IC card, a transponder, a bill, securities, a passport, an electronic apparatus, a bag, a garment, and the like. Further, an ID chip capable of storing needed data in a memory circuit or reading data by a contactless means such as wireless communication is also referred to as a wireless chip.

As set forth above, by applying the invention to manufacturing steps of a semiconductor device used as an ID chip, a manufacturing method of a semiconductor device with improved throughput can be provided. In addition, according to the invention, an ID chip that is not easily counterfeited can be manufactured.

BRIEF DESCRIPTION OF DRAWINGS

FIGS. 1A to 1E show a flow chart of a manufacturing method of a semiconductor device of the invention.

FIGS. 9A to 9H show a flow chart of a manufacturing method of a semiconductor device of the invention.

FIGS. 14A and 14B are cross sectional views showing manufacturing steps of the invention.

BEST MODE FOR CARRYING OUT THE INVENTION

Figure 2:
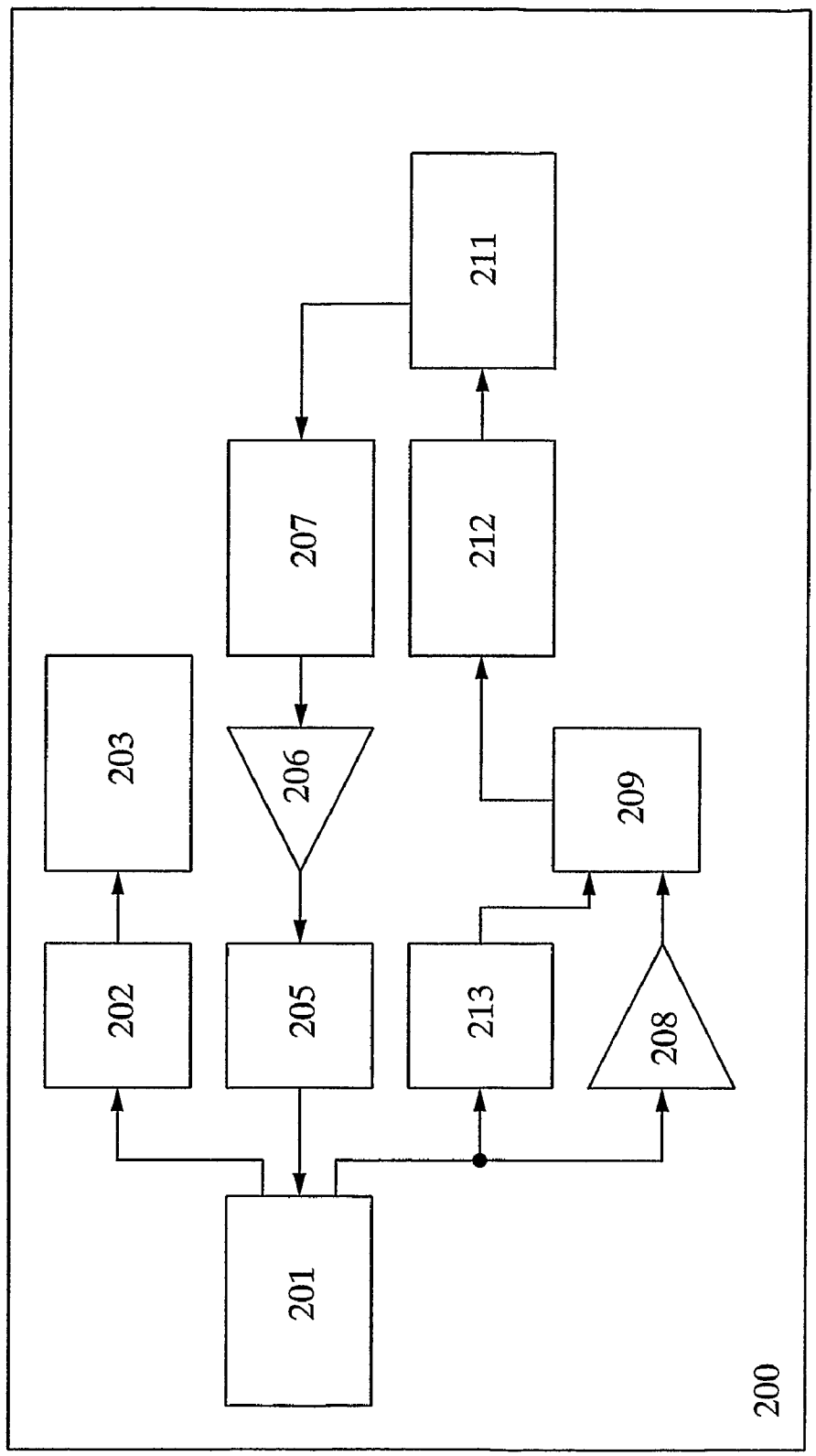
FIG. 2 is a block diagram showing a configuration of a conventional semiconductor device.
Figure 3A:
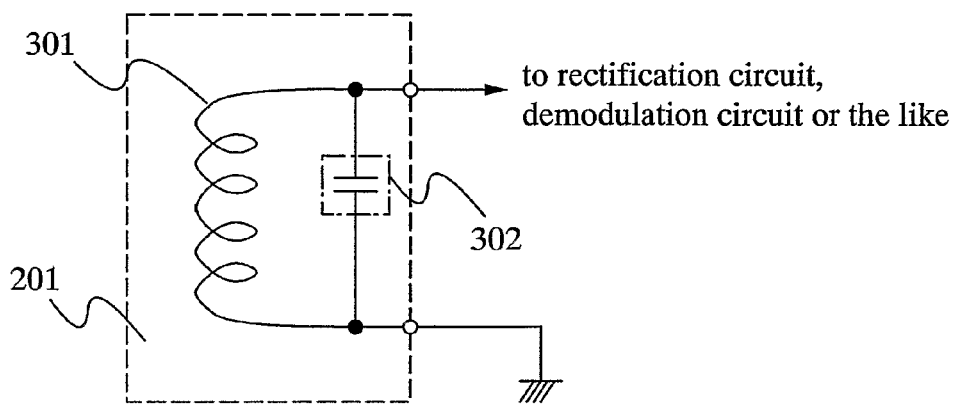
FIGS. 3A and 3B are block diagrams showing a configuration of a conventional semiconductor device.
Figure 3B:
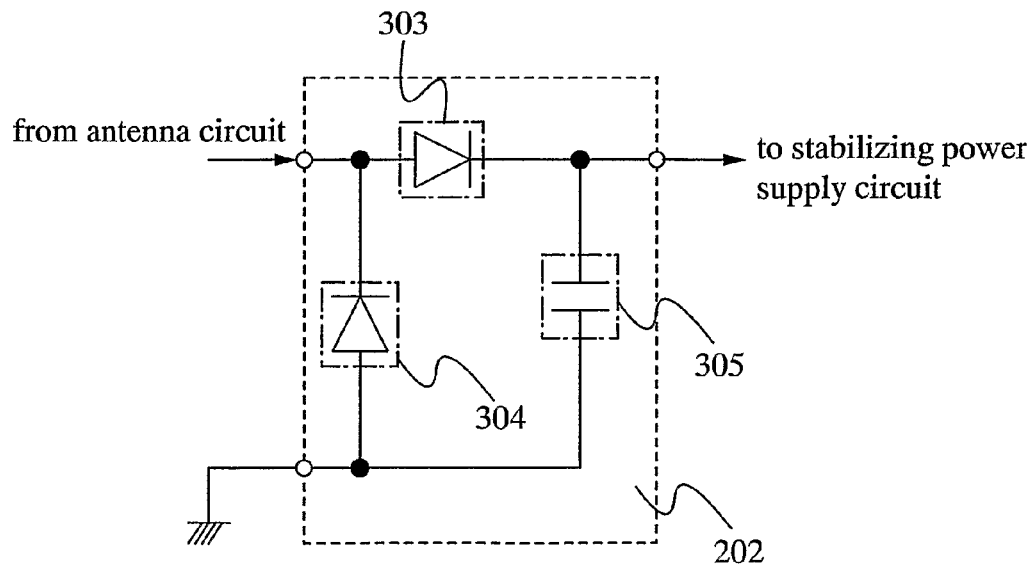
Figure 4:
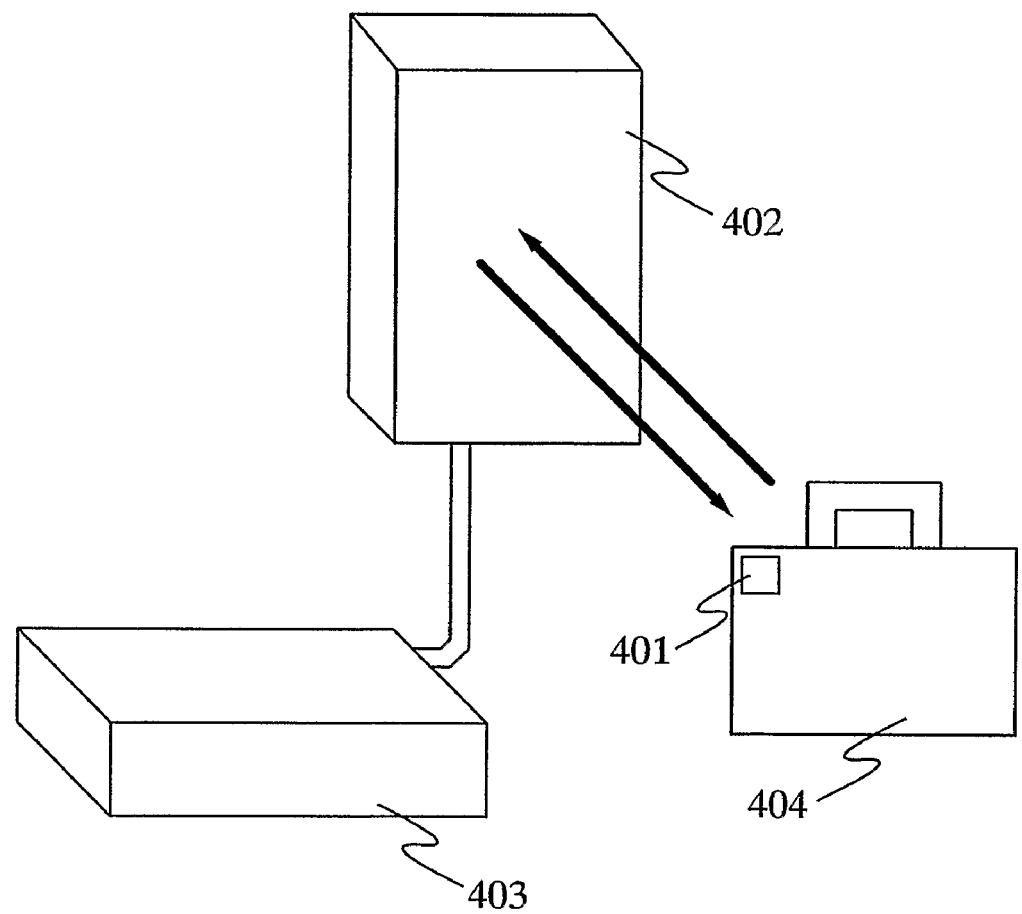
FIG. 4 is a schematic view of an RF tag system.
Figure 5:
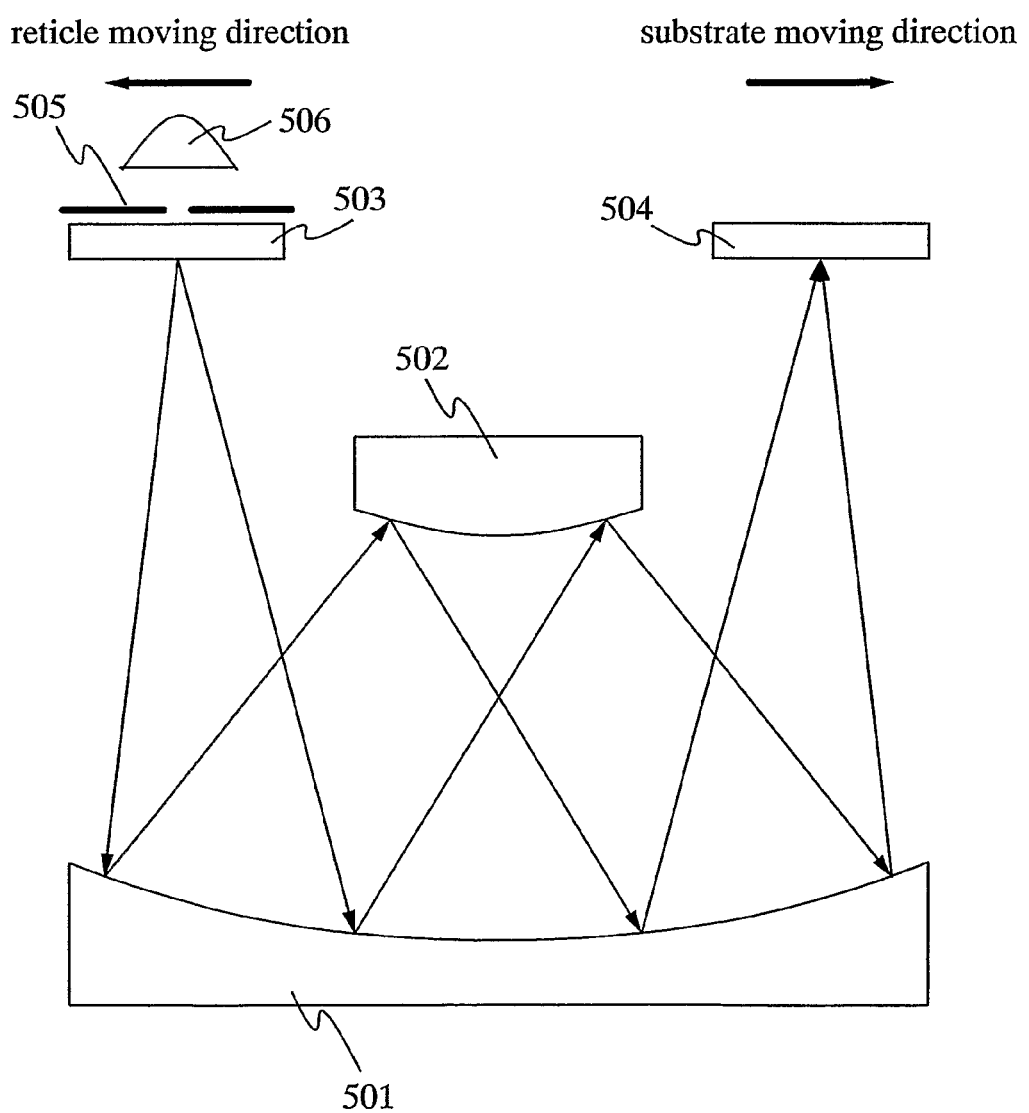
FIG. 5 is a view showing a structure of a mirror projection exposure system.
Figure 6:
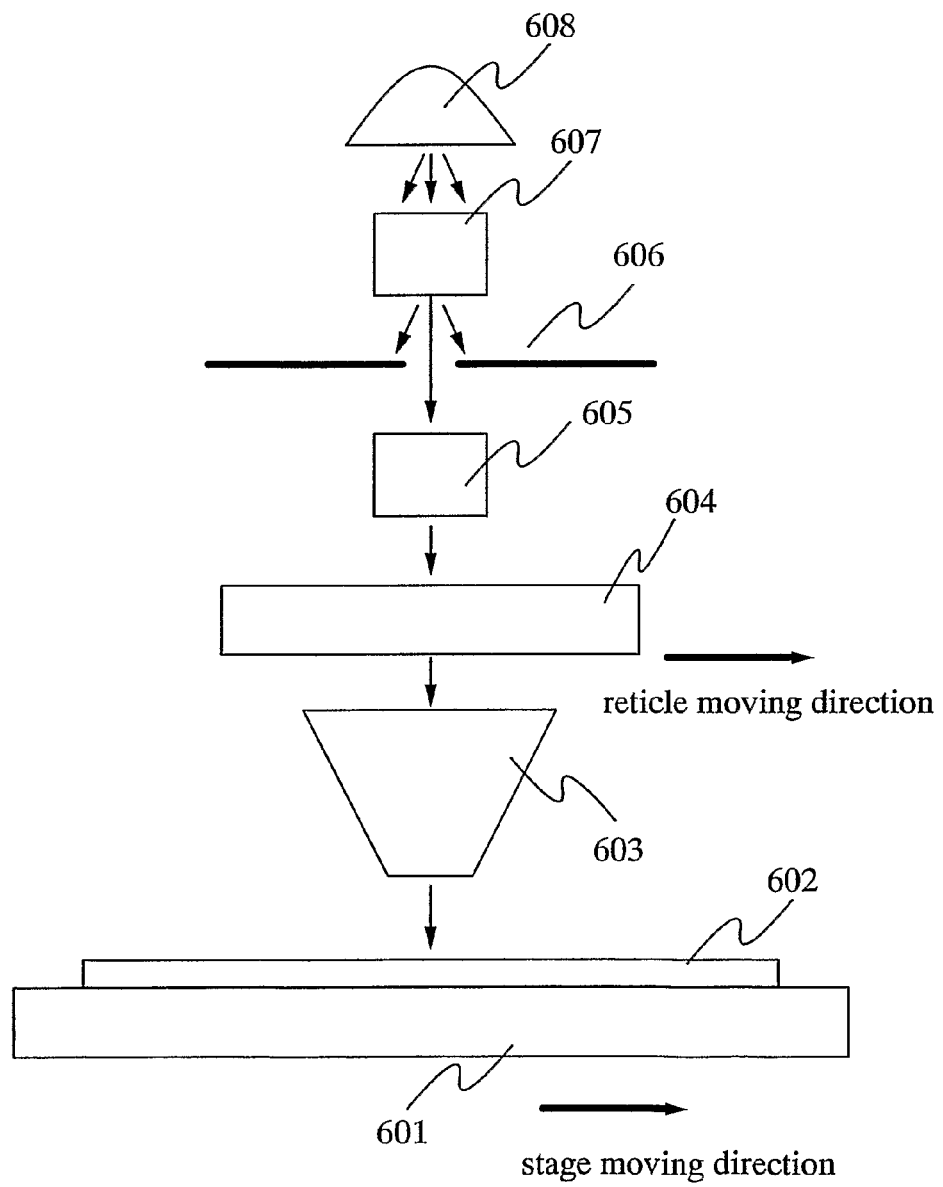
FIG. 6 is a view showing a structure of a step and scan exposure system.

Although the invention will be described by way of Embodiment Mode and Embodiments with reference to the accompanying drawings, it is to be understood that various changes and modifications will be apparent to those skilled in the art. Therefore, unless such changes and modifications depart from the scope of the invention, they should be construed as being included therein. Note that the identical portions or portions having the same function are denoted by the same reference numerals in all the drawings, and will be described in no more detail.

Figure 13:
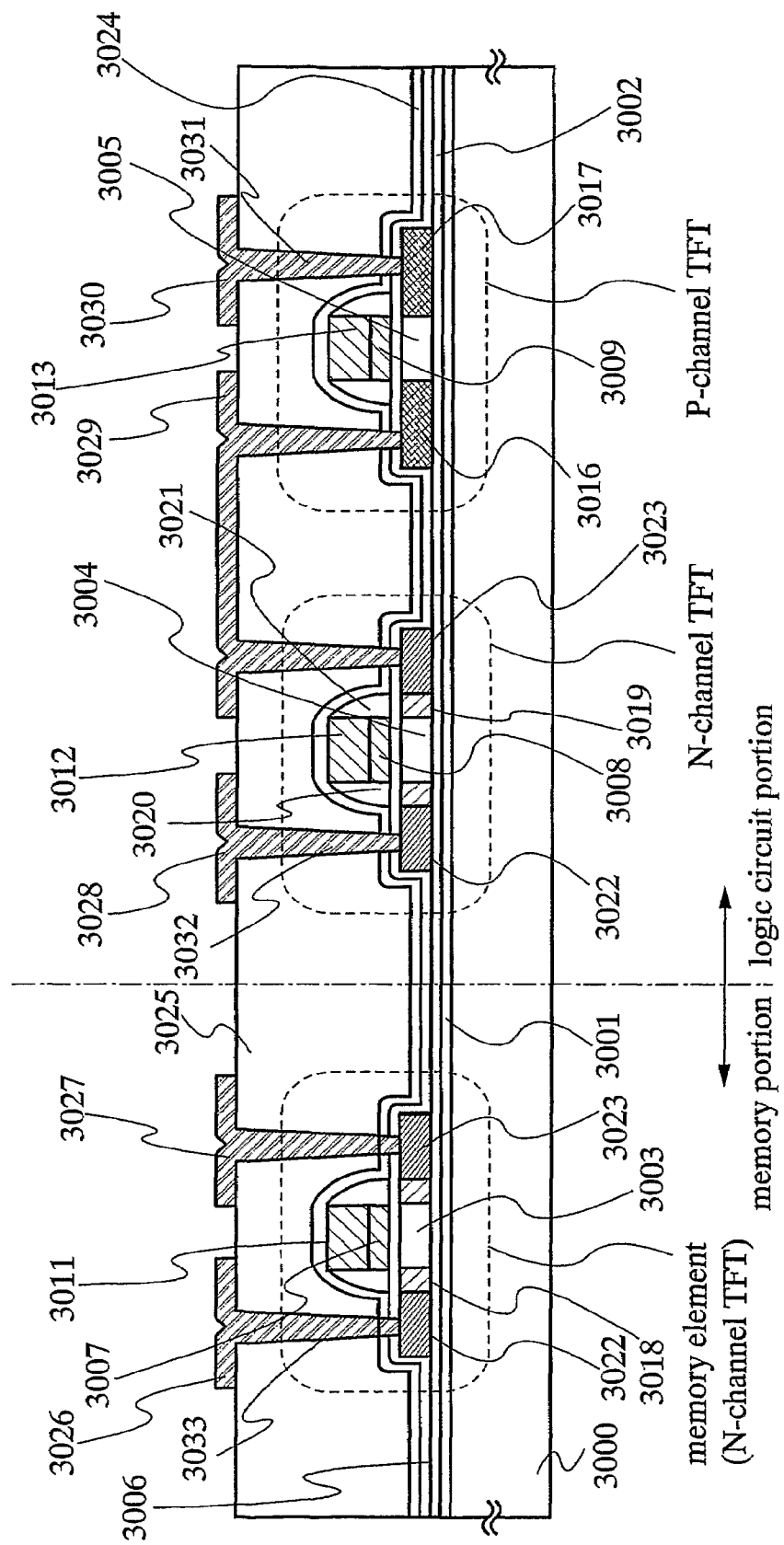
FIG. 13 is a cross sectional view showing a manufacturing step of the invention.

Described with reference to FIG. 13 is a method of manufacturing TFTs over an insulating substrate, which are used for a nonvolatile memory circuit, a modulation circuit, a demodulation circuit, a logic circuit, and the like. Note that in this embodiment mode, an N-channel thin film transistor (hereinafter referred to as a TFT), and a P-channel TFT are taken as examples of semiconductor elements included in a memory portion and a logic circuit portion, though the invention is not limited to these. In addition, the manufacturing method over an insulating substrate shown here is just an example, and the invention is not limited to this.

First, base films 3001 and 3002 are formed over an insulating substrate 3000 formed of glass using an insulating film such as a silicon oxide film, a silicon nitride film, a silicon oxynitride film and a silicon nitride oxide film. For example, a silicon oxynitride film with a thickness of 10 to 200 nm is formed as the base film 3001, and a hydrogenated silicon oxynitride film with a thickness of 50 to 200 nm is formed thereon as the base film 3002.

Island shape semiconductor layers 3003 to 3005 are formed of crystalline semiconductor films that are obtained by crystallizing an amorphous semiconductor film by a known laser crystallization method or thermal crystallization method. Each of the island shape semiconductor layers 3003 to 3005 has a thickness of 25 to 80 nm. The material of the crystalline semiconductor films is not exclusively limited, though silicon or silicon germanium (SiGe) alloy is preferably used.

Subsequently, a gate insulating film 3006 is formed so as to cover the island shape semiconductor layers 3003 to 3005. The gate insulating film 3006 is formed of an insulating film containing silicon by plasma CVD or sputtering so as to have a thickness of 10 to 80 nm.

First conductive layers 3007 to 3009 are formed on the gate insulating film 3006. Then, second conductive layers 3011 to 3113 are formed, and the laminations of the first conductive layer 3007 and the second conductive layer 3011, the first conductive layer 3008 and the second conductive layer 3012, and the first conductive layer 3009 and the second conductive layer 3013 (normal TFTs) are etched at a time, thereby a gate electrode of a TFT is formed.

In this embodiment mode, the first conductive layers 3007 to 3009 are each formed of TaN with a thickness of 50 to 100 nm while the second conductive layers 3011 to 3013 are each formed of W with a thickness of 100 to 300 nm. However, the material of the conductive layers is not exclusively limited, and each may be formed of an element selected from Ta, W, Ti, Mo, Al, Cu and the like, or an alloy or a compound mainly containing the aforementioned element.

An element that imparts P-type conductivity is doped to a P-channel TFT used for the logic circuit portion, thereby first impurity regions 3016 and 3017 are formed. Then, an element that imparts N-type conductivity is doped to N-channel TFTs used for the memory portion (the memory element) and the logic circuit portion, thereby second impurity regions 3018 and 3019 as LDD regions are formed. Then, side walls 3020 and 3021 are formed and an element that imparts N-type conductivity is doped to the N-channel TFTs used for the memory portion and the logic circuit portion, thereby third impurity regions 3022 and 3023 are formed. Such doping steps may be performed by ion doping or ion implantation. Through these steps, the impurity regions are formed in each island shape semiconductor layer.

The impurity elements added to each island shape semiconductor layer are activated. This step is performed by thermal annealing using an annealing furnace. Alternatively, laser annealing or rapid thermal annealing (RTA) may be adopted. Further, the island shape semiconductor layers are hydrogenated by applying heat treatment at a temperature of 300 to 450° C. for 1 to 12 hours in an atmosphere containing 3 to 100% of hydrogen. Plasma hydrogenation (using hydrogen excited by plasma) may be performed instead.

A first interlayer insulating film 3024 is formed of a silicon oxynitride film. The thickness of the first interlayer insulating film 3024 is set 10 to 80 nm similarly to that of the gate insulating film. Then, a second interlayer insulating film 3025 is formed using an organic insulating material such as acrylic. Instead of the organic insulating material, an inorganic material may also be used as the second interlayer insulating film 3025. As the inorganic material, inorganic $SiO_2$, $SiO_2$ obtained by plasma CVD (PCVD-$SiO_2$), SOG (Spin On Glass; silicon oxide coated film), or the like is used.

In each of the aforementioned patterning steps, a resist is exposed by a first exposure means (e.g., mirror projection exposure, step and repeat exposure (stepper exposure), step and scan exposure, and the like) to form a pattern, and etching is performed using the resist as a mask.

If a contact hole is formed in the aforementioned interlayer film, a different method than the above is used. First, a resist is applied and baking is performed as shown in FIG. 1A. Next, areas other than the data portion of a nonvolatile memory circuit are formed by exposing the resist by the first exposure means, that is mirror projection exposure, step and repeat exposure, step and scan exposure or the like (FIG. 1B). Such an exposure means is extremely effective for forming the same pattern in quantities. Contact holes 3031 and 3032 in FIG. 13 are formed by the exposing manner.

Subsequently, contact holes in the data portion of a nonvolatile memory circuit, or contact holes in the data portion and a part of a chip are formed by exposing the resist by a second exposure means (electron beam exposure, laser exposure or the like) (FIG. 1C). A contact hole 3033 in FIG. 13 is formed in this manner. The exposure means such as electron beam exposure allows the exposure contents to be changed depending on program, therefore, a memory circuit, a chip and the like each including different memory data can be manufactured on the same substrate. In addition, an area formed by the second exposure means such as electron beam exposure occupies a small area such as the data portion of a nonvolatile memory circuit, or the data portion and a part of a chip, thus, decrease in throughput can be suppressed as much as possible.

After development and the like (FIG. 1D), the interlayer film is etched to form a contact hole (FIG. 1E).

Then, electrodes 3026 and 3027 connected to source and drain regions of the island shape semiconductor layer are formed in the memory portion. Similarly in the logic circuit portion, electrodes 3028 to 3030 are formed.

In the aforementioned forming steps of contact holes, the conventional mirror projection exposure, step and repeat exposure or step and scan exposure is performed in combination with the electron beam exposure or the laser exposure. According to this, chips having different data can be manufactured over the same substrate with improved throughput. Such a method may be applied to other steps such as source and drain electrodes forming steps and doping steps as well as the contact hole forming steps.

In this manner, the memory portion having the nonvolatile memory element and the logic circuit portion having an N-channel TFT with LDD structure and a P-channel TFT with single drain structure can be formed over the same substrate (see FIG. 13).

Alternatively, after the common part is formed, a data portion of a nonvolatile memory circuit may be formed as shown in FIGS. 9A to 9H. First, a resist is applied and baking is performed (FIG. 9A). Next, exposure is performed to the resist for the common part by a first exposure means (mirror projection exposure, step and repeat exposure, step and scan exposure or the like) (FIG. 9B). Then, development, baking or the like are performed (FIG. 9C). A pattern of the common part is formed by etching (FIG. 9D). A resist is applied again and baking is performed (FIG. 9E). The resist for a data portion of a nonvolatile memory circuit is exposed by a second exposure means (electron beam exposure, laser exposure or the like) (FIG. 9F). Then, development, baking or the like are performed (FIG. 9G). Then, a pattern such as the data portion of the nonvolatile memory circuit is formed by etching (FIG. 9H). In such a manner, different data can be stored in each chip and a semiconductor device can be manufactured while maintaining throughput.

In this embodiment mode, steps of forming a memory portion and a logic circuit portion and transferring them to a support base such as a flexible substrate are described with reference to FIGS. 14A and 14B and FIGS. 15A and 15B. Note that in this embodiment mode, a nonvolatile memory element, an N-channel TFT and a P-channel TFT are taken as examples of the semiconductor elements included in the memory portion and the logic circuit portion, though the invention is not limited to these. In addition, the manufacturing method over an insulating substrate shown here is just an example, and the invention is not limited to this.

A peeling layer 4000 is formed over the insulating substrate 3000. The peeling layer 4000 may be formed by sputtering, plasma CVD or the like using a film mainly containing silicon such as amorphous silicon, polycrystalline silicon, single crystalline silicon, and microcrystalline silicon (including semi-amorphous silicon). In this embodiment mode, an amorphous silicon film with a thickness of about 500 nm is formed by sputtering to be used as the peeling layer 4000. Then, a memory portion and a logic circuit portion as shown in FIG. 13 are formed by the above described manufacturing steps.

Subsequently, a third interlayer insulating film 4001 is formed over the second interlayer insulating film 3025, and pads 4002 to 4005 are formed using a conductive material having one or more metals selected from Ag, Au, Cu, Pd, Cr, Mo, Ti, Ta, W, Al and the like, or metal compounds containing them.

A protective layer 4006 is formed over the third interlayer insulating film 4001 so as to cover the pads 4002 to 4005. The protective layer 4006 is formed of a material that can protect the pads 4002 to 4005 when removing the peeling layer 4000 by etching. For example, the protective layer 4006 may be formed by applying on the entire surface an epoxy resin, an acrylate resin, or a silicon resin that is soluble in water or alcohols (FIG. 14A).

A groove 4007 for separating the peeling layer 4000 is formed (FIG. 14B). The groove 4007 is formed by etching, dicing, scribing or the like so as to expose the peeling layer 4000.

Figure 15A:
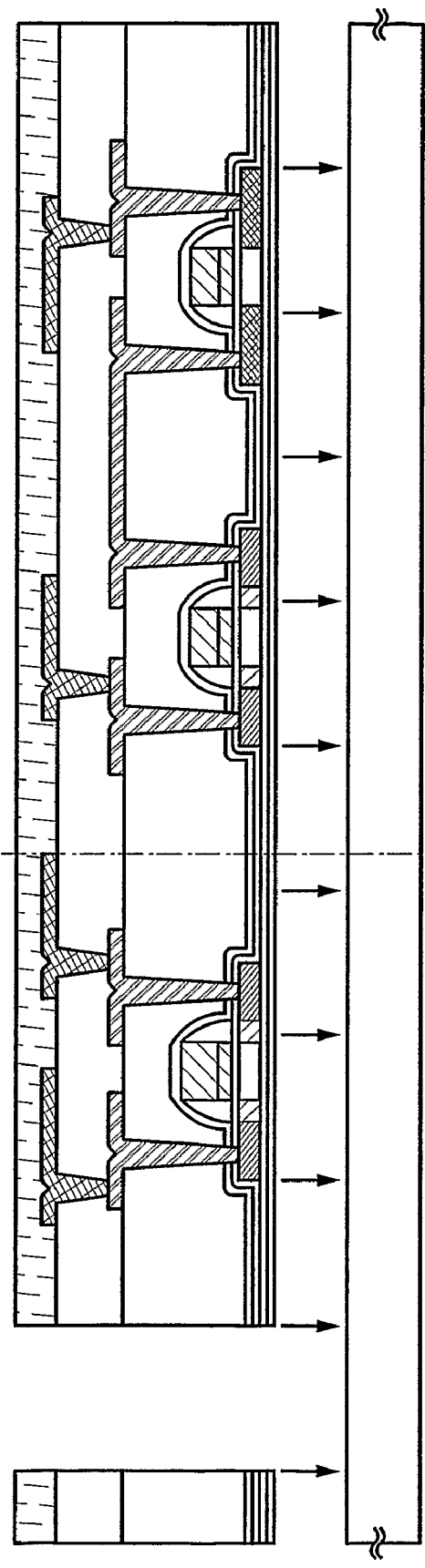
FIGS. 15A and 15B are cross sectional views showing manufacturing steps of the invention.

The peeling layer 4000 is removed by etching (FIG. 15A). In this embodiment mode, fluorine halide is used as an etching gas and introduced into the groove 4007. For example, etching may be performed using $ClF_3$ (chlorine trifluoride) at a temperature of 350° C., a flow rate of 300 sccm, and a pressure of 6 Torr for three hours. Alternatively, $ClF_3$ gas mixed with nitrogen may be used as well. The peeling layer 4000 can be selectively etched by using fluorine halide such as $ClF_3$, and thus the insulating substrate 3000 can be peeled off. Note that fluorine halide may be either a gas or a liquid.

Figure 15B:
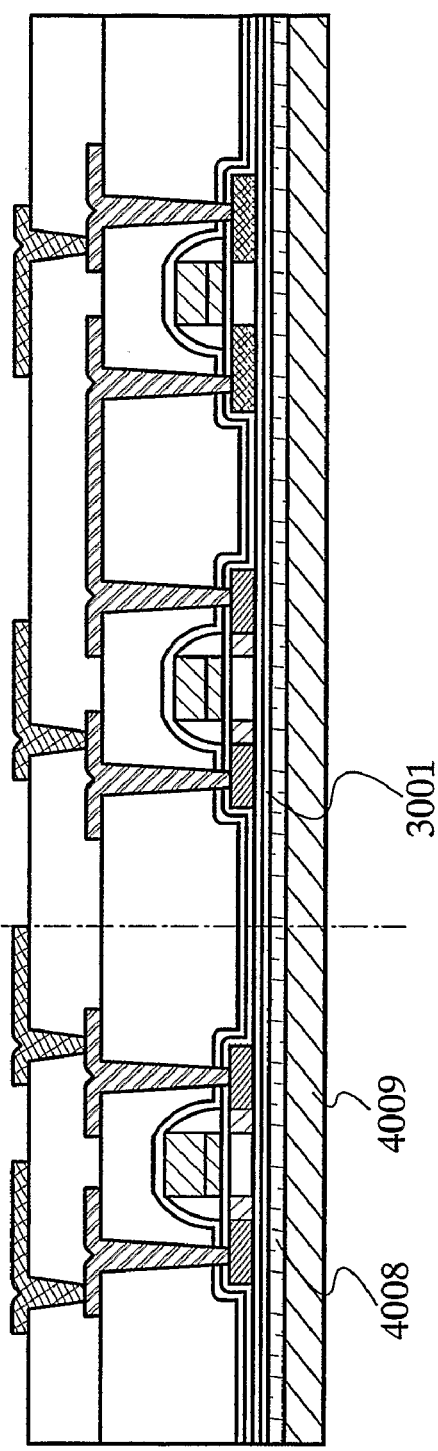

The peeled memory portion and logic circuit portion are attached to a support base 4009 with an adhesive 4008 (FIG. 15B). The adhesive 4008 is formed of a material capable of attaching the support base 4009 to the base film 3001. As the adhesive 4008, for example, various curable adhesives may be used such as a reactive curable adhesive, a heat curable adhesive, a photo-curable adhesive such as an ultraviolet curable adhesive, and an anaerobic adhesive.

For the support base 4009, a flexible organic material such as paper and plastic can be used. Alternatively, the support base 4009 may be formed of a flexible inorganic material. It is desirable that the support base 4009 have a high thermal conductivity of about 2 to 30 W/mK in order to disperse the heat generated in an integrated circuit.

A method of peeling off the integrated circuit in the memory portion and the logic circuit portion from the insulating substrate 3000 is not limited to the one using the etching of a layer mainly containing silicon as shown in this embodiment mode, and other various methods may be adopted. For example, there are a method where a metal oxide film is formed between a heat resistant substrate and an integrated circuit, and the metal oxide film is weakened by crystallization to peel off the integrated circuit; a method where a peeling layer light is destroyed by laser irradiation to peel off an integrated circuit from a substrate; and a method where a substrate on which an integrated circuit is formed is removed mechanically or by etching using a solution or a gas to peel off the integrated circuit from the substrate.

If the surface of an object is curved and thereby the support base of an ID chip attached to the curved surface is curved so as to have a curved surface along a generating line such as a conical surface and a columnar surface, it is desirable to make the direction of the generating line be the same as the moving direction of carriers of the TFT. According to the aforementioned structure, it can be suppressed that the characteristics of the TFT are affected when the support base is curved. By setting the ratio of an area occupied by the island shape semiconductor film in the integrated circuit to be 1 to 30%, it can further be suppressed that the characteristics of the TFT are affected when the support base is curved. This embodiment mode can be implemented in combination with other embodiments.

Embodiment 1

Figure 7:
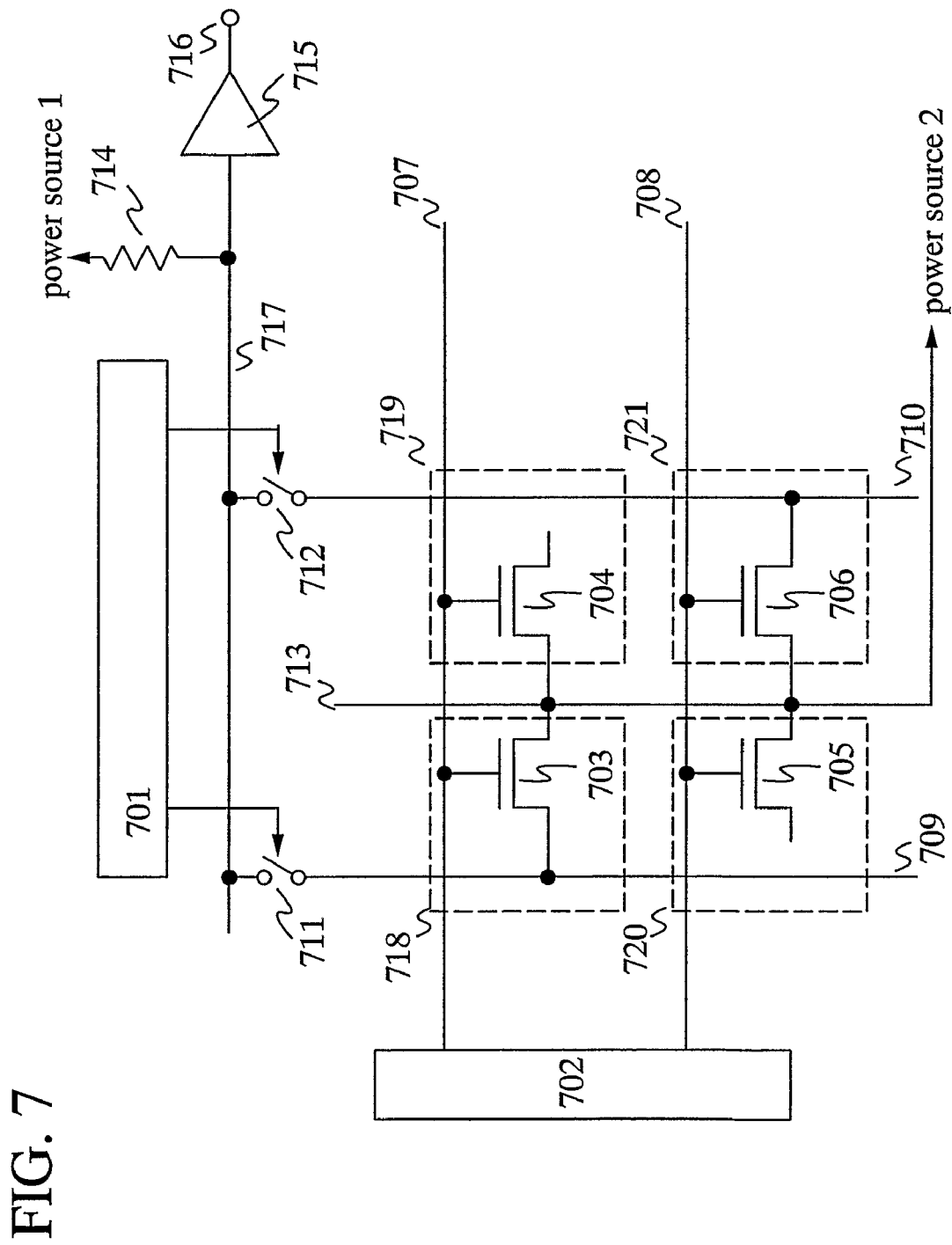
FIG. 7 is a circuit diagram of a mask ROM.

An embodiment of a nonvolatile memory circuit using a mask ROM is shown in FIG. 7. The nonvolatile memory circuit shown in FIG. 7 indicates the storage state depending on whether a contact hole is formed in the drain terminal of a TFT.

The operation of the nonvolatile memory circuit using a mask ROM is now described with reference to FIG. 7. In FIG. 7, a 4-bit memory circuit is shown as the nonvolatile memory circuit for simplicity, though the invention is not limited to the 4-bit memory circuit. The nonvolatile memory circuit includes a column decoder 701, a row decoder 702, an amplifier 715, N-channel TFTs 703 to 706, bit lines (data lines) 709 and 710, word lines 707 and 708, a power supply line 713, column switches 711 and 712, an output wiring 717, a load resistor 714, an output terminal 716, a power supply 1, and a power supply 2. Instead of the load resistor 714, a constant current source may be used.

The power supply 1 sets a high potential whereas the power supply 2 sets a low potential. However, in the case of the TFTs 703 to 706 being P-channel TFTs, the power supply 1 sets a low potential whereas the power supply 2 sets a high potential. In this embodiment, N-channel TFTs are used for the TFTs 703 to 706, and the power supply 1 is +3 V whereas the power supply 2 is 0 V, though these conditions may be changed arbitrarily. Memory cells 718 to 721 are constituted by the TFTs 703 to 706 respectively.

The case of reading data is described below. When reading data of the memory cell 718, the row decoder 702 operates to activate the word line 707, thereby the TFTs 703 and 704 are turned on. Then, the column decoder 701 operates to turn on the column switch 711, thereby the bit line 709 is connected to the output wiring 717, the load resistor 714 and the amplifier 715. Since the TFT 703 is turned on, a current flows to the power supply 2 through the power supply 1, the load resistor 714, the output wiring 717, the column switch 711, the data line 709, the TFT 703, and the power supply line 713. As a result, the memory cell 718 outputs a low signal.

When reading data of the memory cell 719, the row decoder 702 operates to activate the word line 707, thereby the TFTs 703 and 704 are turned on. Then, the column decoder 701 operates to turn on the column switch 712, thereby the bit line 710 is connected to the output wiring 717, the load resistor 714 and the amplifier 715. Although the TFT 703 is on, the drain terminal of the TFT 704 is not connected to anywhere, thus no current flows. The memory cell 719 outputs a high signal, since no current flows while the potential of the power supply 1 is supplied to the load resistor 714, the output wiring 717, the column switch 712, and the data line 710.

When reading data of the memory cell 720, the row decoder 702 operates to activate the word line 708, thereby the TFTs 705 and 706 are turned on. Then, the column decoder 701 operates to turn on the column switch 711, thereby the bit line 709 is connected to the output wiring 717, the load resistor 714 and the amplifier 715. Although the TFT 705 is on, the drain terminal of the TFT 705 is not connected to anywhere, thus no current flows. The memory cell 720 outputs a high signal, since no current flows while the potential of the power supply 1 is supplied to the load resistor 714, the output wiring 717, the column switch 711, and the data line 709.

When reading data of the memory cell 721, the row decoder 702 operates to activate the word line 708, thereby the TFTs 705 and 706 are turned on. Then, the column decoder 701 operates to turn on the column switch 712, thereby the bit line 710 is connected to the output wiring 717, the load resistor 714 and the amplifier 715. Since the TFT 706 is on, a current flows to the power supply 2 through the power supply 1, the load resistor 714, the output wiring 717, the column switch 712, the data line 710, the TFT 706, and the power supply line 713. As a result, the memory cell 721 outputs a low signal.

In this manner, data stored in the memory can be read to the output terminal 716.

Embodiment 2

Figure 8:
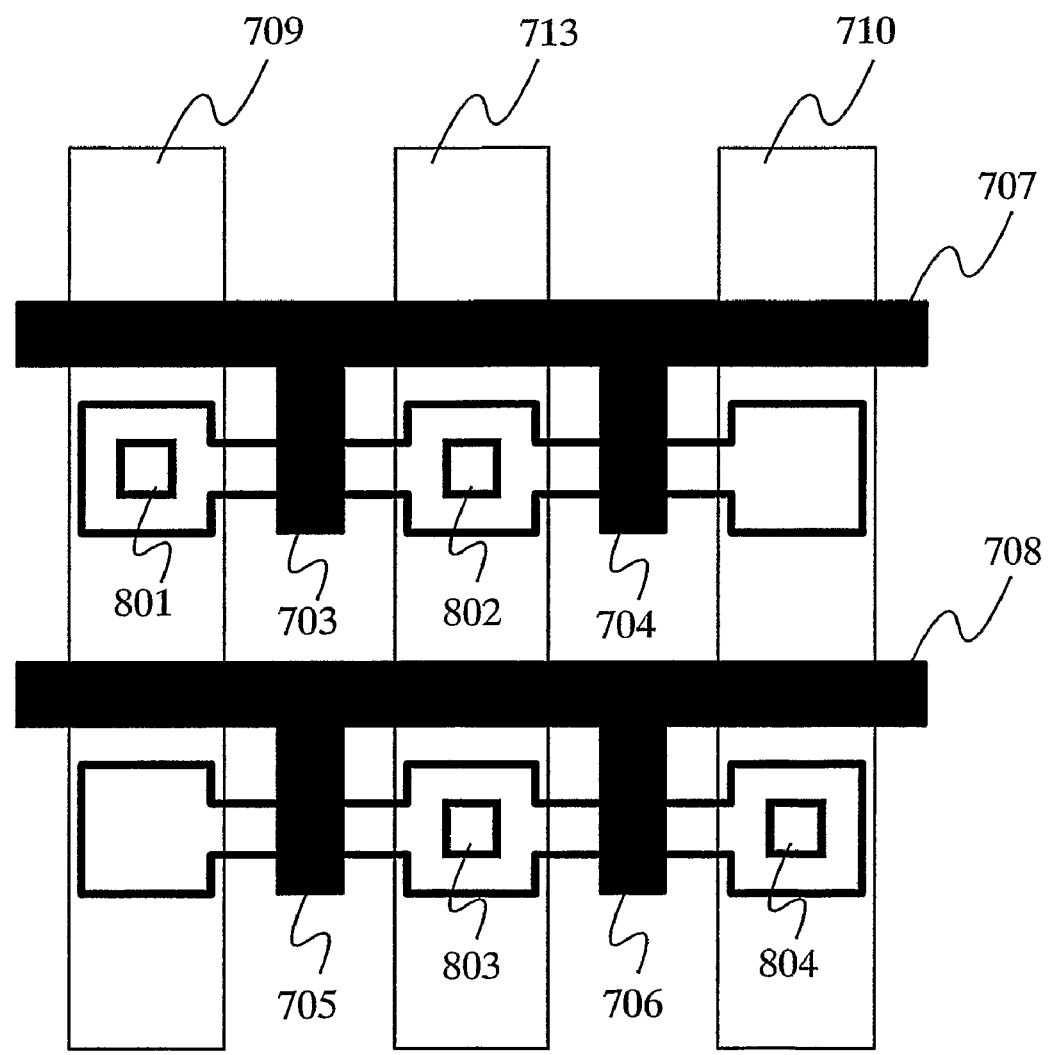
FIG. 8 is a layout diagram of a mask ROM.

FIG. 8 is a layout diagram of the memory cell shown in FIG. 7. The layout includes the TFTs 703 to 706, the bit lines (the data lines) 709 and 710, the word lines 707 and 708, and the power supply line 713. The source electrodes of the TFTs 703 to 706 are connected to the power supply line 713 through contact holes 802 and 803. The drain electrode of the TFT 703 is connected to the bit line 709 through a contact hole 801, whereas the drain electrode of the TFT 706 is connected to the bit line 710 through a contact hole 804. The drain electrodes of the TFTs 704 and 705 are not connected to anywhere.

As set forth above, if the contact holes 801 and 804 are formed by electron beam exposure or laser exposure, the position thereof and data stored therein can be changed. For example, the contact hole 801 can be moved to the drain terminal of the TFT 705 by the change in the exposure program.

Data that is independent of the contents of memory data, namely exposure data other than the contact holes 801 and 804 in FIG. 8 can be formed by mirror projection exposure, step and repeat exposure, step and scan exposure or the like.

Embodiment 3

Figure 18A:
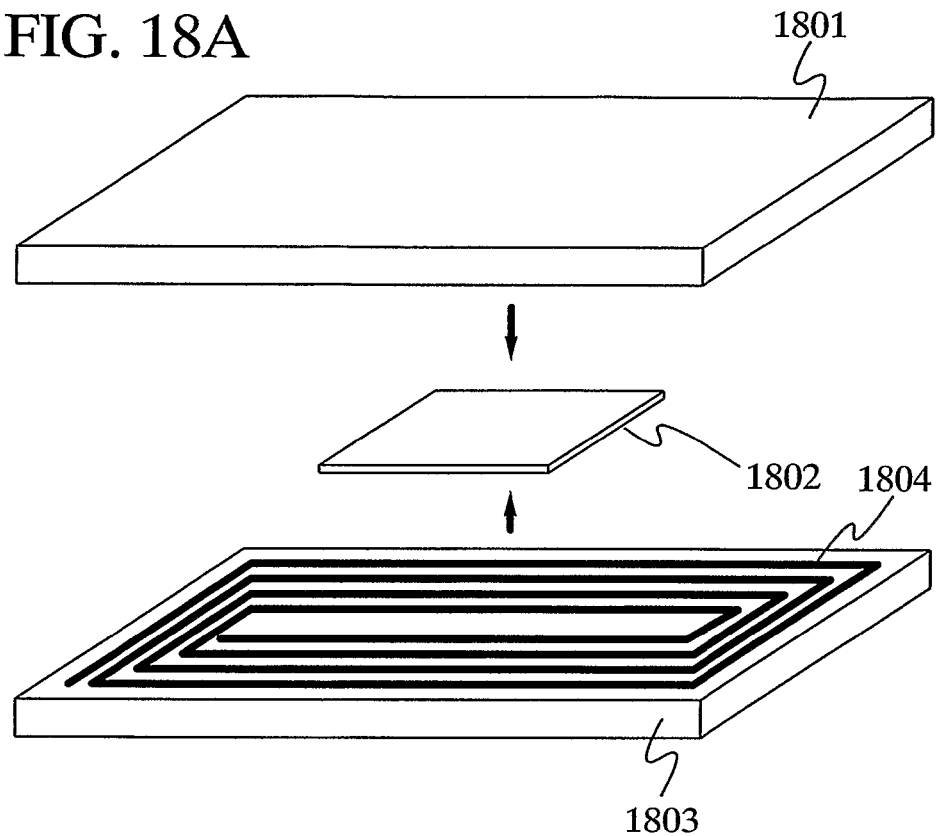
FIGS. 18A and 18B are views showing a combination of a protective film and a semiconductor device of the invention.
Figure 18B:
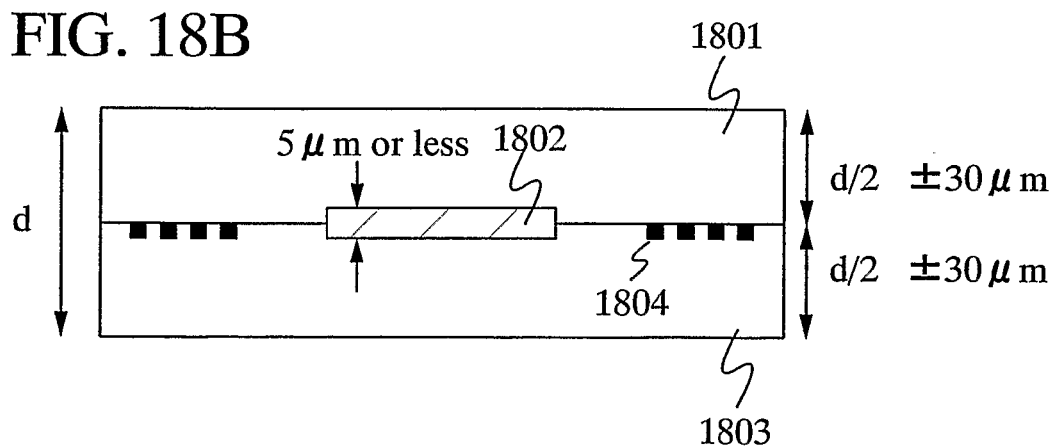

Described with reference to FIGS. 18A and 18B is the case of forming a flexible ID tag by a peeling process. The ID tag is constituted by flexible protective layers 1801 and 1803, and an ID chip 1802 formed by a peeling process. In this embodiment, an antenna 1804 is not formed on the ID chip 1802, but it is formed on the protective layer 1803 and electrically connected to the ID chip 1802. Although the antenna 1804 is formed only on the protective layer 1803 in FIG. 18A, it may be additionally formed on the protective layer 1801. The antenna 1804 is desirably formed of silver, copper, or metal coated with them. The antenna 1804 is connected to the ID chip 1802 by UV treatment using an anisotropic conductive film, though the connecting method is not limited to this.

FIG. 18B is a cross sectional view of FIG. 18A. The ID chip 1802 has a thickness of 5 μm or less, and preferably a thickness of 0.1 to 3 μm. The respective thicknesses of the protective layers 1801 and 1803 are desirably set to be (d/2)±30 μm, and more preferably (d/2)±10 μm, provided that the total thickness thereof is d. It is desirable that the protective layers 1801 and 1803 each have a thickness of 10 to 200 μm. The area of the ID chip 1802 is 5 mm square or less, and preferably 0.3 to 4 mm square.

The protective layers 1801 and 1803 which are formed of an organic resin material have a structure resistant to bending. The ID chip 1802 itself formed by a peeling process is resistant to bending as compared with a single crystalline semiconductor, therefore, it can be attached close to the protective layers 1801 and 1803. Such an ID chip sandwiched between the protective layers 1801 and 1803 may further be disposed on the surface of or inside an object, or incorporated in a piece of paper.

Embodiment 4

Figure 17:
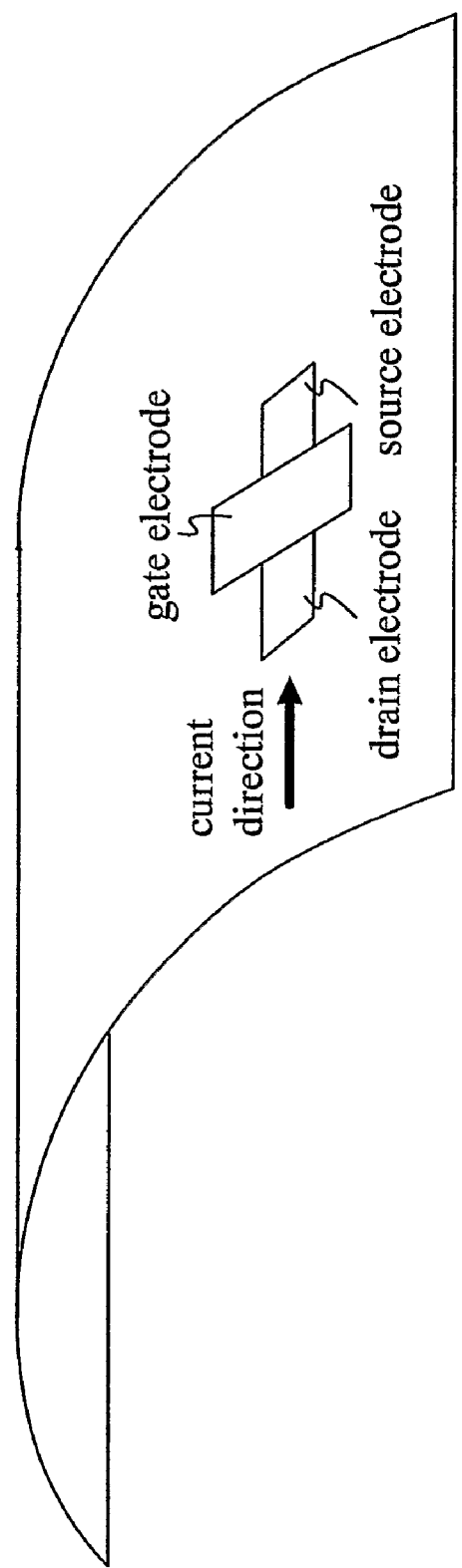
FIG. 17 is a view showing an arrangement of a TFT of the invention.

Described with reference to FIG. 17 is the case where an ID chip is attached to a curved surface, that is a TFT is disposed perpendicular to the arc drawn by the ID chip. A TFT included in the ID chip in FIG. 17 is disposed so that the current direction, namely the drain electrode, the gate electrode and the source electrode of the TFT be perpendicular to the arc drawn by the ID chip, thereby less stress is applied thereto. Such an arrangement allows to suppress variations in characteristics of TFTs. The crystal orientation of the TFT is the same as the current direction. By using CWLC or the like, the S value can be set to 0.35 V/dec or less (preferably 0.09 to 0.25 V/dec), and the mobility to 100 $cm^2$/Vs or more.

A 19-stage ring oscillator constituted by such a TFT has an oscillation frequency of 1 MHz or more, and preferably 100

MHz or more at a power supply voltage of 3 to 5 V. The delay time for each stage of an inverter is 26 ns, and preferably 0.26 ns or less at a power supply voltage of 3 to 5 V.

In order to prevent an active element such as a TFT from being damaged due to stress, the ratio of an area occupied by an active region (silicon island portion) of the active element such as a TFT is desirably 5 to 50% of the entire area.

A region where an active element such as a TFT is not provided mainly includes a base insulating material, an interlayer insulating material and a wiring material. The area other than an active region of a TFT is desirably 60% or more of the entire area.

The thickness of an active region of an active element is 20 to 200 nm, typically 40 to 170 nm, and preferably 45 to 55 nm or 145 to 155 nm.

Embodiment 5

In this embodiment, an example of an antenna attached externally to a circuit using the invention is described with reference to FIGS. 10A to 10E and FIGS. 11A to 11C.

Figure 10A:
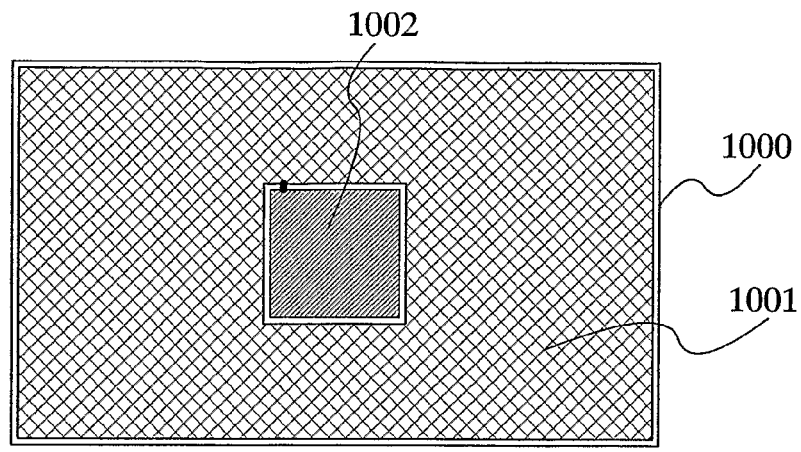
FIGS. 10A to 10E are views showing an embodiment of an antenna of the invention.

FIG. 10A shows a circuit surrounded by an antenna. An antenna 1001 is formed over a substrate 1000, and a circuit 1002 using the invention is connected thereto. In FIG. 10A, the periphery of the circuit 1002 is covered with the antenna 1001, though the entire surface of the substrate may be covered with the antenna 1001 and the circuit 1002 including electrodes may be attached thereon.

Figure 10B:
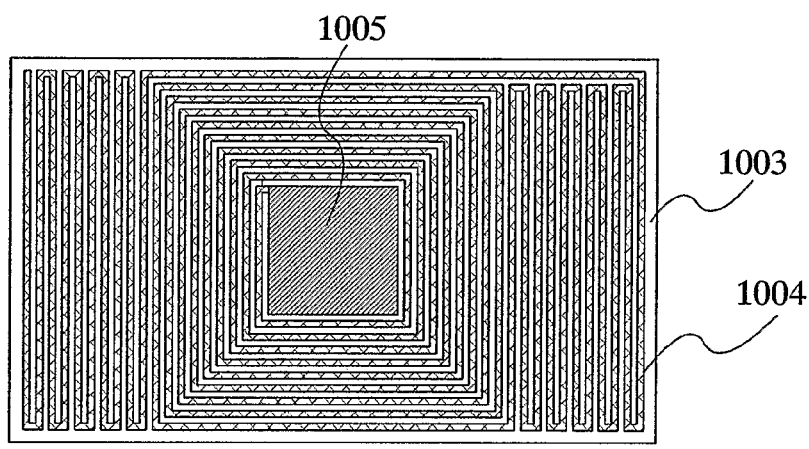

In FIG. 10B, a thin antenna is disposed so as to circle around a circuit. An antenna 1004 is formed over a substrate 1003, and a circuit 1005 using the invention is connected thereto. Note that the arrangement of the antenna wiring shown here is just an example, and the invention is not limited to this.

Figure 10C:
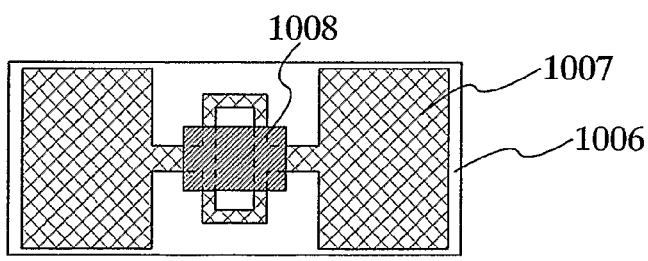

FIG. 10C shows an RF antenna. An antenna 1007 is formed over a substrate 1006, and a circuit 1008 using the invention is connected thereto.

Figure 10D:
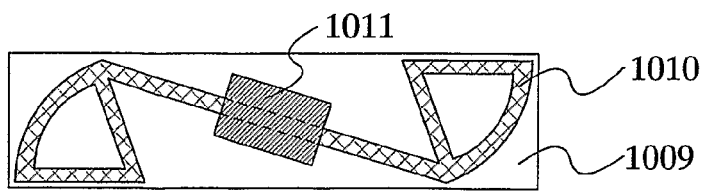

FIG. 10D shows a 180° omnidirectional antenna (capable of receiving radio waves from any direction). An antenna 1010 is formed over a substrate 1009, and a circuit 1011 using the invention is connected thereto.

Figure 10E:
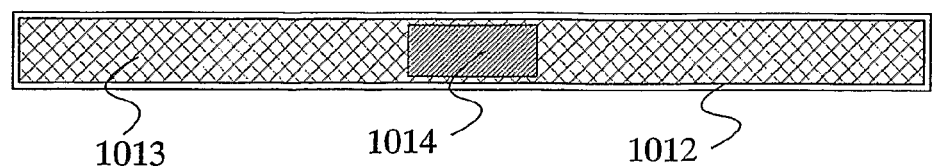

FIG. 10E shows an antenna formed in a stick shape. An antenna 1013 is formed over a substrate 1012, and a circuit 1014 using the invention is connected thereto.

The circuit using the invention can be connected to such an antenna by a known method. For example, the circuit and the antenna may be connected by wire bonding or bump bonding. Alternatively, a surface of the circuit formed as a chip may be used as an electrode to be attached to the antenna. In the latter case, the circuit can be attached to the antenna by using an ACF (Anisotropic Conductive Film).

An appropriate length of the antenna is different depending on the frequency used for reception. It is generally preferable that the antenna be as long as a wavelength divided by an integer. For example, if the frequency is 2.45 GHz, the antenna is preferably about 60 mm (half wavelength) or about 30 mm (quarter wavelength).

Figure 11A:
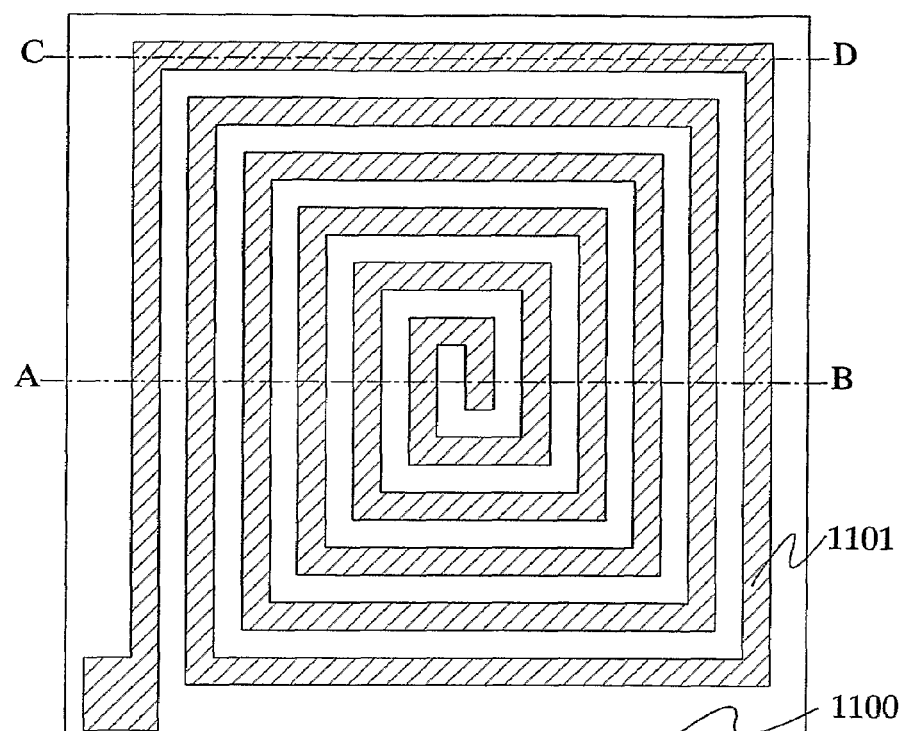
FIGS. 11A to 11C are views showing an embodiment of an antenna of the invention.
Figure 11B:
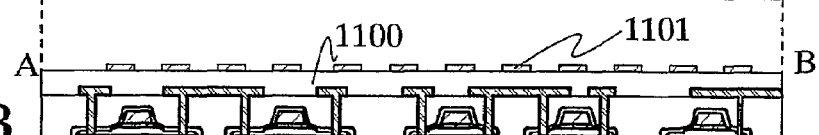
Figure 11C:
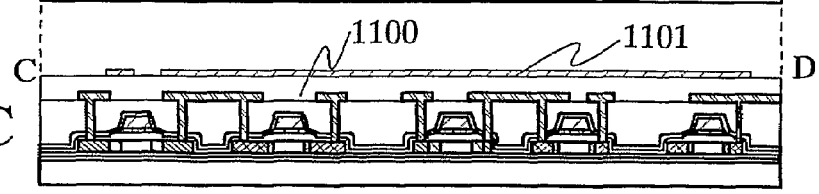
Figure 12:
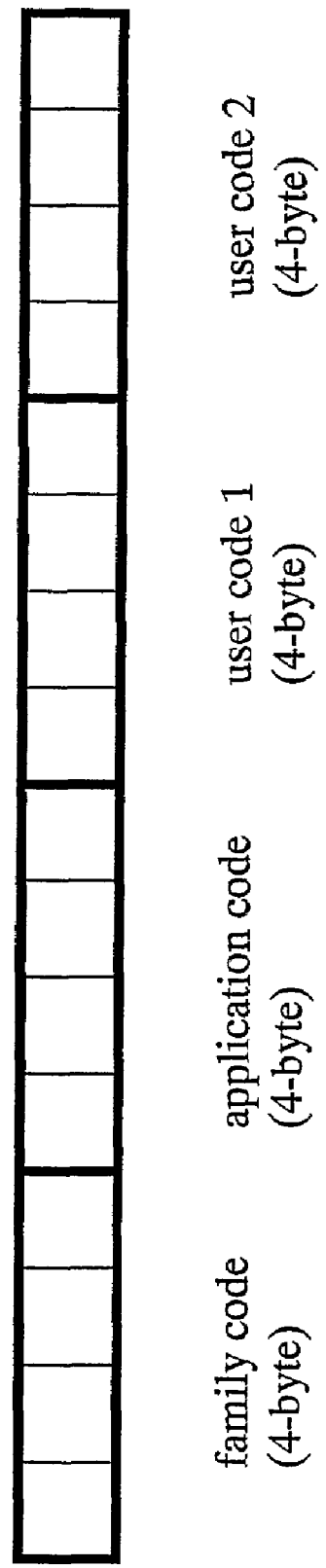
FIG. 12 is a view showing an example of data stored in a memory circuit.

It is also possible to attach another substrate to the circuit of the invention and form an antenna thereover FIGS. 11A to 11C show a top plan view and cross-sectional views of a circuit over which a substrate 1100 (an upper substrate) is attached and a spiral antenna 1101 (an antenna wiring) is provided thereover.

Note that the antenna shown in this embodiment is just an example and the shape of the antenna is not limited to this. The invention can be implemented with any form of antenna.

This embodiment can be implemented in combination with Embodiment Mode and Embodiments 1 to 4.

Embodiment 6

In this embodiment, a method for manufacturing a thin film integrated circuit device including a TFT is described in detail with reference to FIGS. 19A to 19E, FIGS. 20A to 20D and FIGS. 21A and 21B. For simplicity, the manufacturing method is described herein by showing a cross sectional structure of a CPU (logic circuit portion) and a memory portion using an N-channel TFT and a P-channel TFT.

Figure 19A:
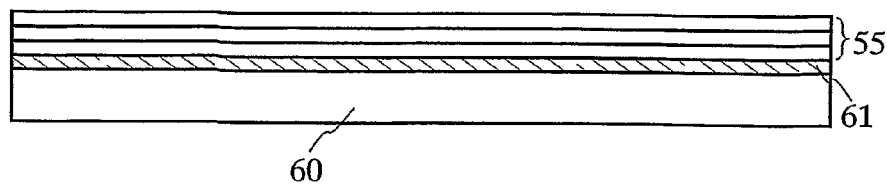
FIGS. 19A to 19E are cross sectional views showing manufacturing steps of the invention.

First, a peeling layer 61 is formed over a substrate 60 (FIG. 19A). The peeling layer 61 here is formed over a glass substrate (e.g., a 1737 substrate, product of Corning Incorporated) by low pressure CVD using an a-Si film (amorphous silicon film) with a thickness of 50 nm (500 Å). As for the substrate 60, a quartz substrate, a substrate made of an insulating material such as alumina, a silicon wafer substrate, a plastic substrate having enough heat resistance to the treatment temperature in the subsequent step, and the like may be employed as well as the glass substrate.

The peeling layer 61 is preferably formed of a film mainly containing silicon such as polycrystalline silicon, single crystalline silicon and SAS (semi-amorphous silicon that is also referred to as microcrystalline silicon) as well as amorphous silicon, though the invention is not limited to these. The peeling layer 61 may be formed by plasma CVD or sputtering as well as low pressure CVD. A film doped with an impurity such as phosphorous may be employed as well. The thickness of the peeling layer 61 is desirably 50 to 60 nm, though it may be 30 to 50 nm in the case of employing an SAS.

Next, a protective film 55 (also referred to as a base film or a base insulating film) is formed over the peeling layer 61 (FIG. 19A). Here, the protective film 55 is constituted by three layers of a SiON (silicon oxide containing nitrogen) film with a thickness of 100 nm, a SiNO (silicon nitride containing oxygen) film with a thickness of 50 nm, and a SiON film with a thickness of 100 nm in this order, though the material, the thickness, and the number of layers are not limited to these. For example, instead of the SiON film on the bottom layer, a heat resistant resin such as siloxane with a thickness of 0.5 to 3 μm may be formed by spin coating, slit coating, droplet discharging, or the like. Alternatively, a silicon nitride film (SiN, $Si_3N_4$ or the like) may be employed. Instead of the SiON film on the top layer, a silicon oxide film may be employed. The respective thicknesses of the layers are preferably set to 0.05 to 3 μm and can be selected within this range as required.

A silicon oxide film can be formed by thermal CVD, plasma CVD, atmospheric pressure CVD, bias ECRCVD, or the like using a mixed gas such as $SiH_4/O_2$ and TEOS (tetraethoxy silane)/$O_2$. A silicon nitride film can be typically formed by plasma CVD using a mixed gas of $SiH_4/NH_3$. A SiON film or a SiNO film can be typically formed by plasma CVD using a mixed gas of $SiH_4/N_2O$.

Note that if a material mainly containing silicon such as a-Si is employed for the peeling layer 61 and an island shape semiconductor film 57, the protective film 55 that is in contact with them may be formed of $SiO_xN_y$ (x>y>0) in view of the adhesiveness.

Subsequently, thin film transistors (TFTs) for constituting a CPU (logic circuit portion) and a memory portion of a thin film integrated circuit device are formed over the protective film 55. Note that other thin film active elements such as organic TFTs and thin film diodes may be formed as well as the TFTs.

Figure 19B:
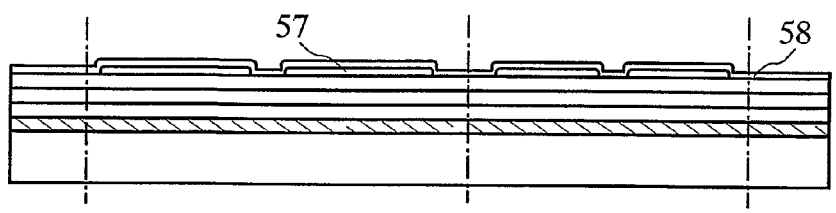

In order to form a TFT, first, the island shape semiconductor film 57 is formed over the protective film 55 (FIG. 19B). The island shape semiconductor film 57 is formed of an amorphous semiconductor, a crystalline semiconductor or a semi-amorphous semiconductor, which mainly contains silicon, silicon germanium (SiGe), or the like.

In this embodiment, an amorphous silicon film with a thickness of 70 nm is formed and the surface thereof is treated with a solution containing nickel. Thermal crystallization is performed at a temperature of 500 to 750° C. so that a crystalline silicon semiconductor film is obtained. Then, the crystallinity thereof is improved by laser crystallization. Note that the film may be formed by plasma CVD, sputtering, LPCVD, or the like. As a crystallizing method, laser crystallization, thermal crystallization, or thermal crystallization using a catalyst (Fe, Ru, Rh, Pd, Os, Ir, Pt, Cu, Au, or the like) may be adopted, or such methods may be performed alternately a plurality of times.

Alternatively, the semiconductor film having an amorphous structure may be crystallized by a continuous wave laser. In order to obtain a crystal with a large grain size during crystallization, a solid state laser capable of continuous wave may be used and it is preferable to apply second to fourth harmonics of a fundamental wave (the crystallization in this case is referred to as CWLC). Typically, a second harmonic (532 nm) or a third harmonic (355 nm) of a Nd:YVO$_4$ laser (a fundamental wave: 1064 nm) is applied. When a continuous wave laser is used, laser light emitted from a continuous wave YVO$_4$ laser of which output is 10 W is converted into a harmonic by a non-linear optical element. There is also a method for emitting a harmonic by putting a YVO$_4$ crystal or a GdVO$_4$ crystal and a non-linear optical element in a resonator. Then, the laser light is preferably formed in a rectangular shape or an ellipse shape at an irradiated surface with an optical system to irradiate a subject. In that case, the energy density of about 0.01 to 100 MW/cm$^2$ (preferably 0.1 to 10 MW/cm$^2$) is required. Then, the semiconductor film is preferably irradiated with laser light while being moved relatively to the laser light at a speed of about 10 to 2000 cm/sec.

When a pulsed laser is used, a pulsed laser having a frequency band of several tens to several hundreds Hz is generally used, though a pulsed laser having an extremely higher oscillation frequency of 10 MHz or more may be used as well (the crystallization in this case is referred to as MHzLC). It is said that it takes several tens to several hundreds nsec to solidify a semiconductor film completely after the semiconductor film is irradiated with the pulsed laser light. When the pulsed laser light has an oscillation frequency of 10 MHz or more, it is possible to irradiate the next pulsed laser light before the semiconductor film is solidified after it is melted by the previous laser light. Therefore, unlike the case of the conventional pulsed laser, the interface between the solid phase and the liquid phase can be moved continuously in the semiconductor film, and thus the semiconductor film having a crystal grain grown continuously along the scanning direction can be formed. More specifically, it is possible to form an aggregation of crystal grains each of which has a width of 10 to 30 μm in the scanning direction and a width of about 1 to 5 μm in the direction perpendicular to the scanning direction. By forming such single crystal grains extending long in the scanning direction, a semiconductor film having few grain boundaries at least in the channel direction of the TFT can be formed.

Note that when the protective film 55 is partially formed of siloxane that is a heat resistant organic resin, heat leak from the semiconductor film can be prevented in the aforementioned crystallization, leading to effective crystallization.

The crystalline silicon semiconductor film is obtained through the aforementioned steps. The crystals thereof are preferably aligned in the same direction as the source, channel and drain direction. The thickness of the crystalline layer thereof is preferably 20 to 200 nm (typically 40 to 170 nm, and more preferably 50 to 150 nm). Subsequently, an amorphous silicon film for gettering of a metal catalyst is formed over the semiconductor film with an oxide film interposed therebetween, and heat treatment is performed at a temperature of 500 to 750° C. for gettering. Furthermore, in order to control a threshold value as a TFT element, boron ions are injected into the crystalline silicon semiconductor film at a dosage of from $10^{13}$/cm$^2$ to less than $10^{14}$/cm$^2$. Then, etching is performed with a resist used as a mask to form the island shape semiconductor film 57.

Alternatively, the crystalline semiconductor film may be obtained by forming a polycrystalline semiconductor film directly by LPCVD (Low Pressure CVD) using a source gas of disilane (Si$_2$H$_6$) and germanium fluoride (GeF$_4$). The flow rate of the gas is such that Si$_2$H$_6$/GeF$_4$=20/0.9, the temperature for forming the film is 400 to 500° C., and He or Ar is used as a carrier gas, though the invention is not limited to these conditions.

A TFT, particularly the channel region thereof is preferably added with hydrogen or halogen of $1 \times 10^{19}$ to $1 \times 10^{22}$ cm$^{-3}$, and more preferably $1 \times 10^{19}$ to $5 \times 10^{20}$ cm$^{-3}$. In the case of an SAS, it is preferably added with hydrogen or halogen of $1 \times 10^{19}$ to $2 \times 10^{21}$ cm$^{-3}$. In either case, it is desirable that the amount of hydrogen or halogen be larger than that contained in single crystals used for an IC chip. According to this, local cracks that may be generated at the TFT portion can be terminated by hydrogen or halogen.

Then, a gate insulating film 58 is formed over the island shape semiconductor film 57 (FIG. 19B). The gate insulating film 58 is preferably formed of a single layer or laminated layers of a film containing silicon nitride, silicon oxide, silicon nitride oxide, or silicon oxynitride by a thin film forming method such as plasma CVD and sputtering. In the case of the laminated layers, a three-layer structure may be adopted for example, where a silicon oxide film, a silicon nitride film and a silicon oxide film are laminated in this order over the substrate.

Figure 19C:
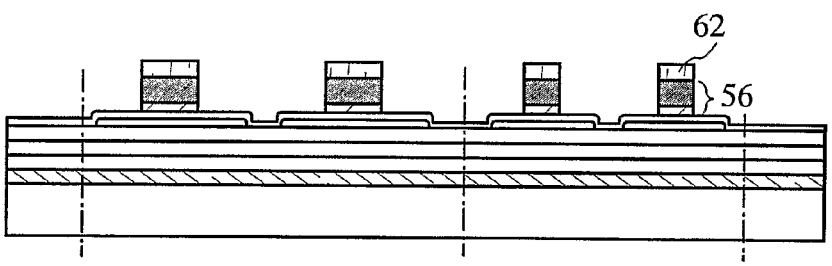
Figure 19D:
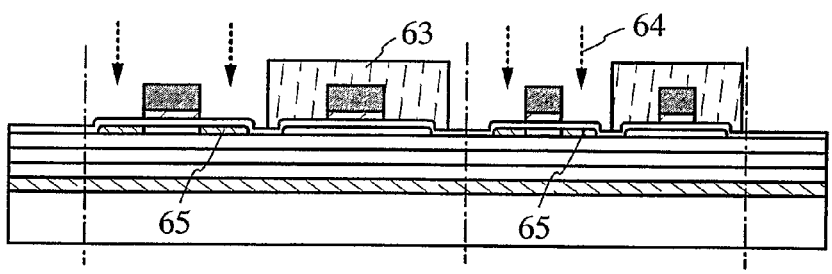
Figure 19E:
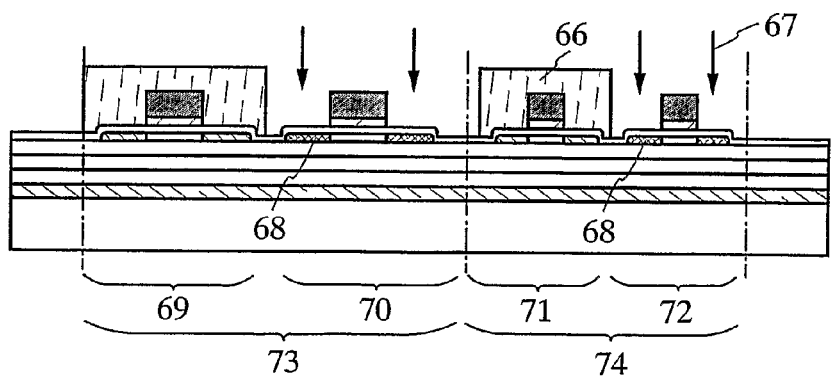

Subsequently, a gate electrode 56 is formed (FIG. 19C). In this embodiment, Si and W (tungsten) are laminated by sputtering, and etched with a resist 62 used as a mask to form the gate electrode 56. Needless to say, the material, the structure and the forming method of the gate electrode 56 are not limited to these and can be selected appropriately. For example, a laminated structure of Si and NiSi (Nickel Silicide) doped with an N-type impurity, or a laminated structure of TaN (tantalum nitride) and W (tungsten) may be employed. Alternatively, the gate electrode 56 may be formed of a single layer employing any conductive material.

A mask of SiO$_x$ or the like may be used instead of the resist mask. In this case, a patterning step of the mask such as SiO$_x$ and SiON (referred to as a hard mask) is additionally required, while the mask film is less decreased in etching as compared with the resist, thereby a gate electrode layer with a desired width can be formed. Alternatively, the gate electrode 56 may be selectively formed by droplet discharging without using the resist 62.

As for the conductive material, various kinds of materials can be selected depending on the function of the conductive film. When the gate electrode and the antenna are simultaneously formed, the material may be selected in consideration of their functions.

As an etching gas for etching the gate electrode, a mixed gas of $CF_4$, $Cl_2$ and $O_2$, or a $Cl_2$ gas is employed here, though the invention is not limited to this.

Subsequently, a resist 63 is formed so as to cover portions to be P-channel TFTs 70 and 72. An N-type impurity element 64 (typically, P (phosphorous) or As (arsenic)) is doped to the island shape semiconductor films of N-channel TFTs 69 and 71 at a low concentration with the gate electrode used as a mask (a first doping step (lightly doping of N-type impurity element), FIG. 19D). The first doping step is performed under such conditions as a dosage of $1\times10^{13}$ to $6\times10^{13}/cm^2$ and an acceleration voltage of 50 to 70 keV, though the invention is not limited to these conditions. In the first doping step, doping is performed through the gate insulating film 58 to form a couple of low concentration impurity regions 65. Note that the first doping step may be performed to the entire surface without covering the P-channel TFT regions with the resist.

After the resist 63 is removed by ashing or the like, another resist 66 is formed so as to cover the N-channel TFT regions. A P-type impurity element 67 (typically, B (boron)) is doped to the island shape semiconductor films of the P-channel TFTs 70 and 72 at a high concentration with the gate electrode used as a mask (a second doping step (heavily doping of P-type impurity element), FIG. 19E). The second doping step is performed under such conditions as a dosage of $1\times10^{16}$ to $3\times10^{16}/cm^2$ and an acceleration voltage of 20 to 40 keV. In the second doping step, doping is performed through the gate insulating film 58 to form a couple of P-type high concentration impurity regions 68.

Figure 20A:
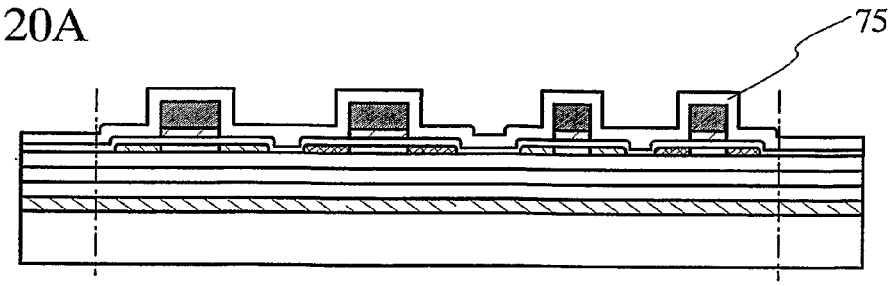
FIGS. 20A to 20D are cross sectional views showing manufacturing steps of the invention.
Figure 20B:
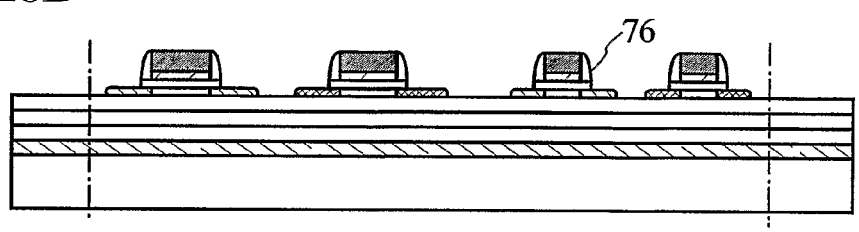
Figure 20C:
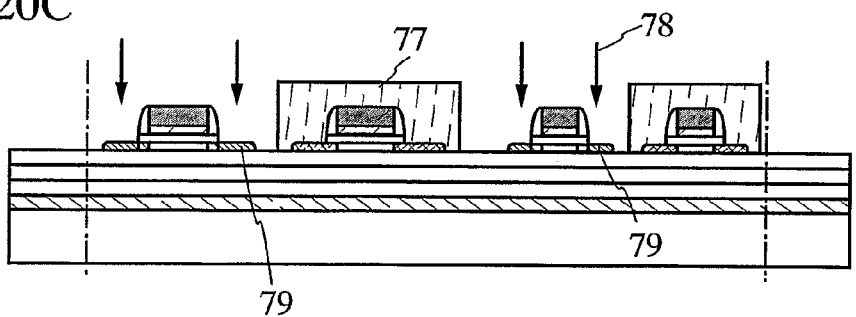

After the resist 66 is removed by ashing or the like, an insulating film 75 is formed over the entire surface of the substrate (FIG. 20A). In this embodiment, a $SiO_2$ film with a thickness of 100 nm is formed by plasma CVD. The insulating film 75 and the gate insulating film 58 are removed by etch back to form a sidewall 76 in a self-aligned manner (FIG. 20B). As an etching gas, a mixed gas of $CHF_3$ and He is employed. Note that the forming step of the sidewall is not limited to this.

Figure 21A:
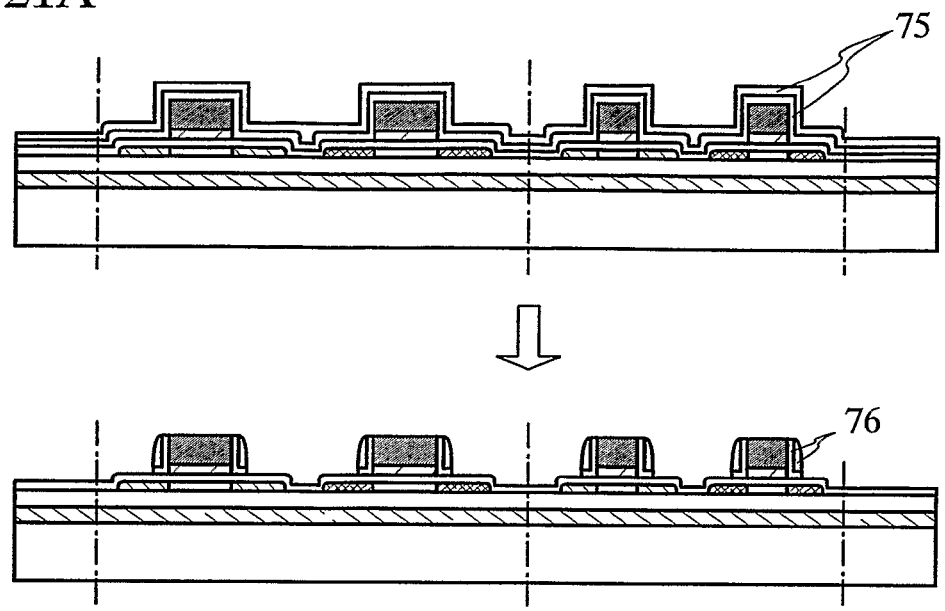
FIGS. 21A and 21B are cross sectional views showing manufacturing steps of the invention.

The forming method of the sidewall 76 is not limited to the aforementioned one. For example, methods shown in FIGS. 21A and 21B may be employed as well. FIG. 21A shows the insulating film 75 having a two or more layer structure. The insulating film 75 has, for example, a two-layer structure of a SiON (silicon oxynitride) film with a thickness of 100 nm and an LTO (Low Temperature Oxide) film with a thickness of 200 nm. In this embodiment, the SiON film is formed by plasma CVD, and the LTO film is obtained by forming a $SiO_2$ film by low pressure CVD. Then, etch back is performed to form the sidewall 76 having an L shape and an arc shape.

Figure 21B:
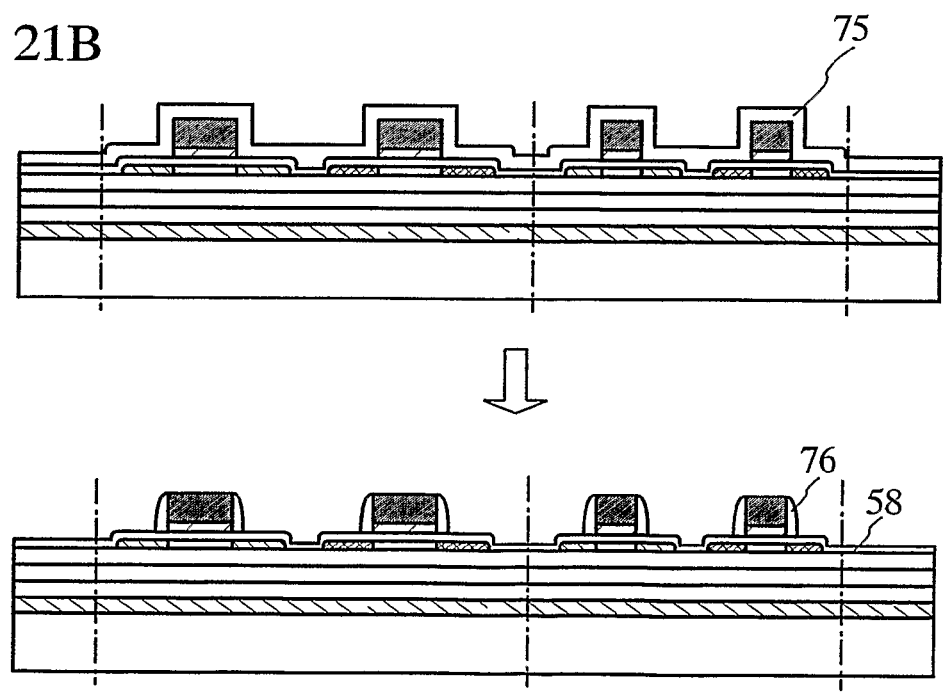

FIG. 21B shows the case where etching is performed so that the gate insulating film 58 is not removed by the etch back. The insulating film 75 in this case may be formed of a single layer or laminated layers.

The sidewall 76 serves as a mask when an N-type impurity is doped at a high concentration in the subsequent step to form a low concentration impurity region or a non-doped offset region under the sidewall 76. In any of the aforementioned forming methods of the sidewall, the conditions of the etch back may be changed depending on the width of the low concentration impurity region or the offset region to be formed.

Subsequently, another resist 77 is formed so as to cover the P-channel TFT regions. An N-type impurity element 78 (typically, P or As) is doped at a high concentration with the gate electrode 56 and the sidewall 76 used as masks (a third doping step (heavily doping of N-type impurity element), FIG. 20C). The third doping step is performed under such conditions as a dosage of $1\times10^{13}$ to $5\times10^{15}/cm^2$ and an acceleration voltage of 60 to 100 keV. In the third doping step, doping is performed to form a couple of N-type high concentration impurity regions 79.

After the resist 77 is removed by ashing or the like, thermal activation of the impurity regions may be performed. For example, a SiON film with a thickness of 50 nm is formed, and then heat treatment is performed at a temperature of 550° C. for four hours in a nitrogen atmosphere. Alternatively, it is also possible that a $SiN_x$ film containing hydrogen is formed to have a thickness of 100 nm and heat treatment is performed at a temperature of 410° C. for one hour in a nitrogen atmosphere. According to this, defects in the crystalline semiconductor film can be improved. This step enables to, for example, terminate a dangling bond in the crystalline silicon and is called a hydrotreatment step or the like. Then, a SiON film with a thickness of 600 nm is formed as a cap insulating film for protecting the TFT. Note that the aforementioned hydrotreatment step may be performed after the formation of this SiON film. In that case, a $SiN_x$ film and a SiON film thereon may be continuously formed. In this manner, the insulating film includes three layers of SiON, $SiN_x$ and SiON that are formed in this order from the substrate side over the TFT, though the structure and the material are not limited to these. Note that such an insulating film is preferably formed, since it also has a function to protect the TFT.

Figure 20D:
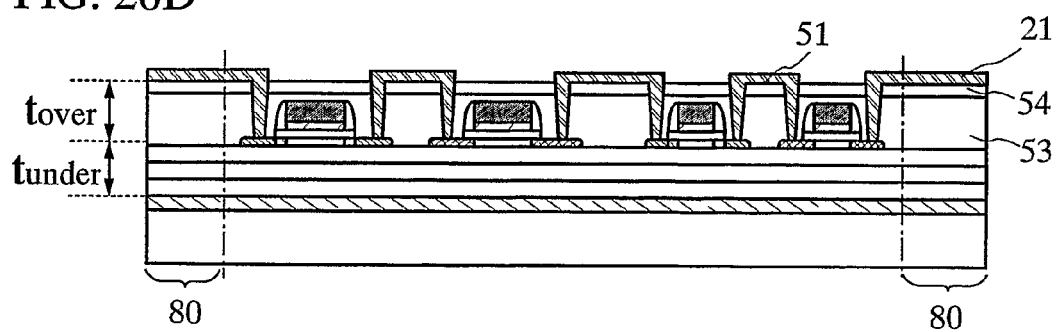

Subsequently, an interlayer film 53 is formed over the TFT (FIG. 20D). For the interlayer film 53, a heat resistant organic resin such as polyimide, acrylic, polyamide, and siloxane may be employed. The interlayer film 53 may be formed by spin coating, dipping, spray application, droplet discharging (inkjet printing, screen printing, offset printing or the like), a doctor knife, a roll coater, a curtain coater, a knife coater, or the like depending on the material thereof. Alternatively, an inorganic material may be employed such as a film of silicon oxide, silicon nitride, silicon oxynitride, PSG (phosphosilicate glass), BPSG (boron phosphosilicate glass), and alumina. These insulating films may be laminated to form the interlayer film 53 as well.

A protective film 54 may be formed over the interlayer film 53. As the protective film 54, a film containing carbon such as DLC (Diamond Like Carbon) and carbon nitride (CN), a silicon oxide film, a silicon nitride film, a silicon nitride oxide film, or the like may be employed. The protective film 54 may be formed by plasma CVD, atmospheric pressure plasma, or the like. Alternatively, a photosensitive or nonphotosensitive organic material such as polyimide, acrylic, polyamide, resist, and benzocyclobutene, or a heat resistant organic resin such as siloxane may be employed.

A filler may be mixed into the interlayer film 53 or the protective film 54 in order to prevent these films from being detached or cracked due to stress generated by a difference of thermal expansion coefficients between the interlayer film 53 or the protective film 54 and a conductive material or the like of a wiring that is formed later.

After forming a resist, etching is performed to form contact holes, so that a wiring 51 for connecting the TFTs to each other and a connecting wiring 21 connected to an external antenna are formed (FIG. 20D). As an etching gas for forming the contact holes, a mixed gas of $CHF_3$ and He is employed, though the invention is not limited to this. The wiring 51 and the connecting wiring 21 may be simultaneously formed using the same material, or may be formed separately. In this embodiment, the wiring 51 connected to the TFTs has a five-layer structure of Ti, TiN, Al—Si, Ti, and TiN that is formed in this order by sputtering and patterning.

By mixing Si into the Al layer, hillock can be prevented from generating in the resist baking when the wiring is patterned. Instead of Si, Cu of about 0.5% may be mixed. When the Al—Si layer is sandwiched between Ti and TiN, hillock resistance can be further improved. In the patterning, the aforementioned hard mask of SiON or the like is preferably employed. Note that the material and the forming method of the wirings are not limited to these, and the aforementioned material for forming the gate electrode may be employed as well.

In this embodiment, the TFT regions for constituting a CPU 73, a memory 74 or the like and a terminal portion 80 connected to an antenna are integrally formed. This embodiment can also be applied to the case where the TFT regions and the antenna are integrally formed. In that case, it is preferable that the antenna be formed over the interlayer film 53 or the protective film 54, and then covered with another protective film. As the conductive material of the antenna, Ag, Au, Al, Cu, Zn, Sn, Ni, Cr, Fe, Co, Ti, or an alloy containing them may be employed, though the invention is not limited to these. The wiring and the antenna may be formed of different materials from each other. It is desirable that the wiring and the antenna be formed of a metal material having high ductility and malleability, and more preferably, the respective thicknesses thereof are increased so as to withstand the stress due to deformation.

As for the forming method, the film may be formed over the entire surface by sputtering and patterned with a resist mask, or may be selectively formed by using a nozzle by droplet discharging. The droplet discharging here includes offset printing, screen printing or the like as well as inkjet printing. The wiring and the antenna may be formed simultaneously, or may be formed separately such that one of them is formed first, and then the other is formed thereon.

Through the aforementioned steps, a thin film integrated circuit device constituted by TFTs is completed. Although a top gate structure is employed in this embodiment, a bottom gate structure (an inversely staggered structure) may be employed as well. A region where a thin film active element such as a TFT is not formed mainly includes a base insulating film material, an interlayer insulating film material and a wiring material. This region preferably occupies 50% or more, and more preferably 70 to 95% of the whole thin film integrated circuit device. As a result, the ID chip can be easily bent, thereby its completed product such as an ID label can be easily handled. In such a case, it is preferable that an island shape semiconductor region (island) of the active element including the TFT portion occupy 1 to 30%, and more preferably 5 to 15% of the whole thin film integrated circuit device.

As shown in FIG. 20D, the thickness of the protective film or the interlayer film in the thin film integrated circuit device is preferably controlled so that the distance ($t_{under}$) between the semiconductor layer of the TFT and the lower protective film may be the same or substantially the same as the distance ($t_{over}$) between the semiconductor layer and the upper interlayer film (or protective film if formed). By disposing the semiconductor layer in the middle of the thin film integrated circuit device in this manner, stress applied to the semiconductor layer can be alleviated, thereby generation of cracks can be prevented.

Embodiment 7

The semiconductor device of the invention can be applied to an IC card, an IC tag, an RFID, a transponder, a bill, securities, a passport, an electronic apparatus, a bag, and a garment. In this embodiment, applications of an IC card, an ID tag and an ID chip are described with reference to FIGS. 16A to 16H.

Figure 16A:
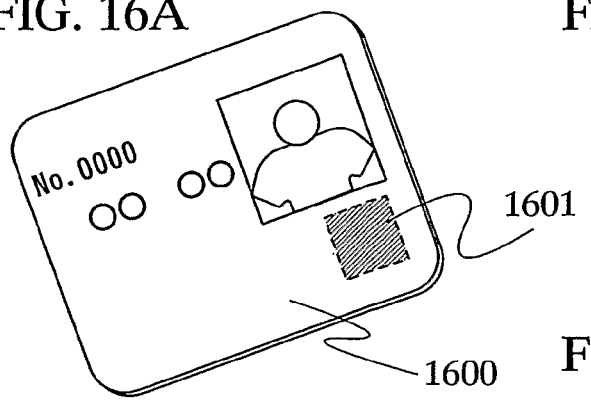
FIGS. 16A to 16H are views showing application examples of the invention.

FIG. 16A shows an IC card that can be used for personal identification as well as for a credit card or electronic money that allows cashless payment by utilizing a rewritable memory circuit incorporated in the IC card. A circuit portion 1601 using the invention is incorporated in an IC card 1600.

Figure 16B:
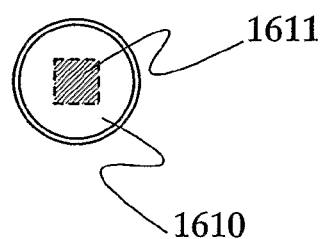

FIG. 16B shows an ID tag that can be used for personal identification as well as for access control to a specific area since it can be miniaturized. A circuit portion 1611 using the invention is incorporated in an ID tag 1610.

Figure 16C:
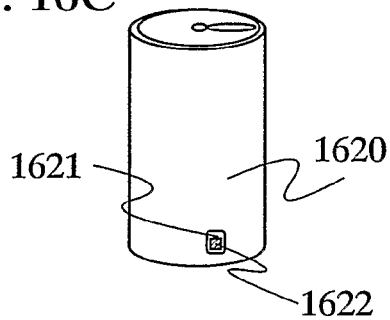

FIG. 16C shows a product 1620 attached with an ID chip 1622 that is used for goods management in retail stores such as supermarkets. The invention is applied to a circuit in the ID chip 1622. By using the ID chip in this manner, stock management can be simplified and shoplifting and the like can be prevented. Although a protective film 1621 that also functions as an adhesive is used to prevent the ID chip 1622 from falling off in the drawing, the ID chip 1622 may be attached directly to the product 1620 with an adhesive. Further, the ID chip 1622 is preferably formed by using the flexible substrate described in Embodiment 2 so as to be easily attached to the product 1620.

Figure 16D:
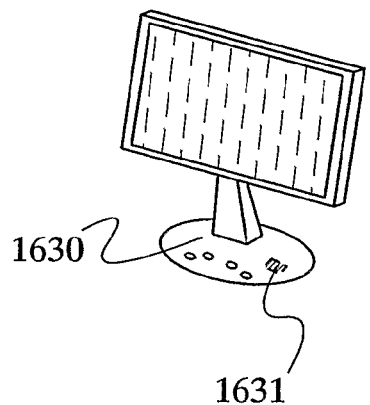

FIG. 16D shows an ID chip for identification that is incorporated in a product in the manufacture thereof. In the drawing, an ID chip 1631 is incorporated in a housing 1630 of a display as an example. The invention is applied to a circuit in the ID chip 1631. Such a structure facilitates manufacturer's identification, distribution management of products, and the like. Although the housing of a display is shown as an example in the drawing, the invention is not limited to this and can be applied to various electronic apparatuses and products.

Figure 16E:
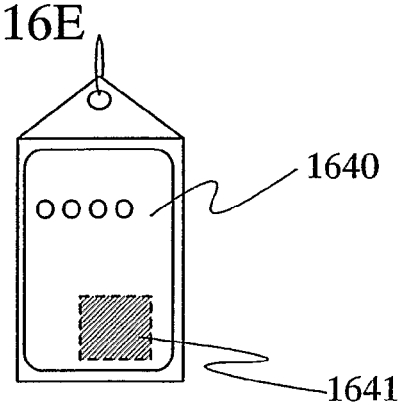

FIG. 16E shows a shipping tag for transporting objects. In the drawing, an ID chip 1641 is incorporated in a shipping tag 1640. The invention is applied to a circuit in the ID chip 1641. Such a structure facilitates selection of delivery destination, distribution management of products and the like. Although the shipping tag is formed so as to be attached to a string for tying an object in the drawing, the invention is not limited to this. Alternatively, the shipping tag may be directly attached to the object with a sealing member or the like.

Figure 16F:
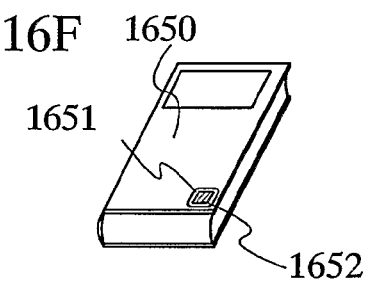

FIG. 16F shows an ID chip 1652 incorporated in a book 1650. The invention is applied to a circuit in the ID chip 1652. Such a structure facilitates distribution management in book stores, rental process in libraries, and the like. Although a protective film 1651 that also functions as an adhesive is used to prevent the ID chip 1652 from falling off in the drawing, the ID chip 1652 may be attached directly to the book 1650 with an adhesive or incorporated in the cover of the book 1650.

Figure 16G:
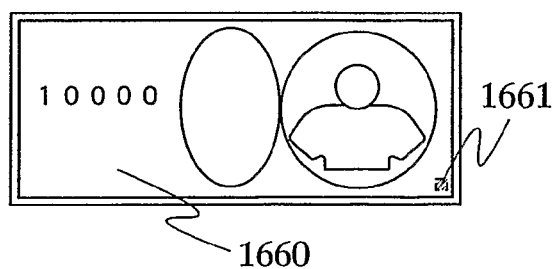

FIG. 16G shows an ID chip 1661 incorporated in a bill 1660. The invention is applied to a circuit in the ID chip 1661. Such a structure easily prevents distribution of counterfeit bills. In view of the properties of bills, it is more preferable that the ID chip 1661 be incorporated in the bill 1660 so as not to be peeled off. The invention can be applied to other paper products such as securities and a passport as well as a bill.

Figure 16H:
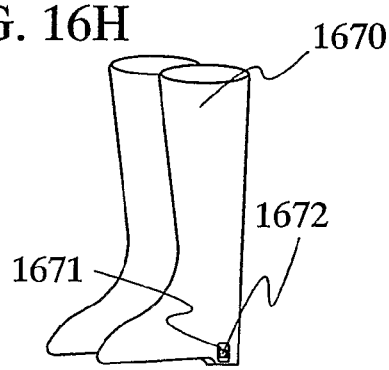

FIG. 16H shows an ID chip 1672 incorporated in a shoe 1670. The invention is applied to a circuit in the RFID chip 1672. Such a structure facilitates manufacturer's identification, distribution management of products, and the like. Although a protective film 1671 that also functions as an adhesive is used to prevent the ID chip 1672 from falling off in the drawing, the ID chip 1672 may be attached directly to the shoe 1670 with an adhesive, or incorporated in the shoe 1670. The invention can be applied to other articles such as a bag and a garment as well as shoes.

Described hereinafter is the case where an ID chip is incorporated in various objects in order to protect the security thereof. Anti-theft security and anti-counterfeit security are essential for the security protection.

Figure 22:
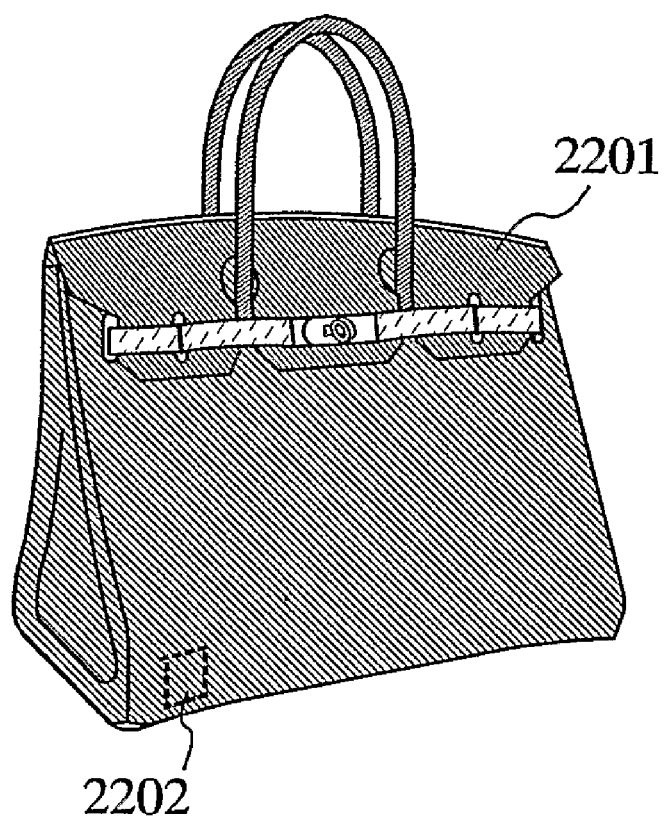
FIG. 22 is a view of a bag using the invention.

For example, an ID chip is incorporated in a bag for anti-theft security. As shown in FIG. 22, an ID chip 2202 is incorporated in a bag 2201. The ID chip 2202 can be incorporated in the bottom or a side of the bag 2201, for example. Being extremely thin and small, the ID chip 2202 can be incorporated in the bag 2201 while maintaining an attractive design thereof. In addition, the ID chip 2202 transmits light, thus a thief cannot easily determine whether the ID chip 2202 is incorporated. Accordingly, there is no fear that the ID chip 2202 may be removed by the thief.

If such a bag incorporating the ID chip is stolen, data on the whereabouts of the bag can be obtained by using, for example, GPS (Global Positioning System). Note that the GPS is a system for determining the position with the time difference between the time a signal was transmitted by a GPS satellite and the time it was received.

Besides the stolen products, the whereabouts of a lost property or a thing left behind can be determined by the GPS.

Besides the bag, the ID chip can be incorporated in a vehicle such as a car and a bicycle, a watch, and accessories.

Described now is the case where an ID chip is incorporated in a passport, a driving license and the like for anti-counterfeit.

Figure 23A:
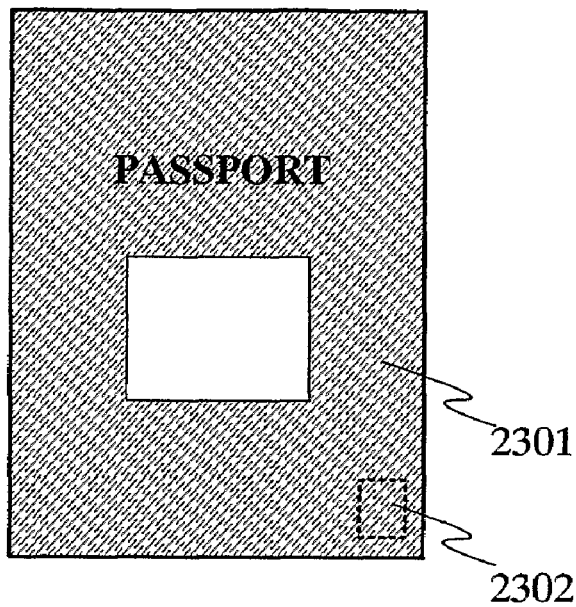
FIGS. 23A and 23B are views of certificates using the invention.

FIG. 23A shows a passport 2301 incorporating an ID chip. Although an ID chip 2302 is incorporated in the cover of the passport 2301 in FIG. 23A, it may be incorporated in other pages. As the ID chip 2302 transmitting light, it may also be mounted on the surface of the cover. Further, the ID chip 2302 may be sandwiched between materials of the cover or the like to be incorporated in the cover.

Figure 23B:
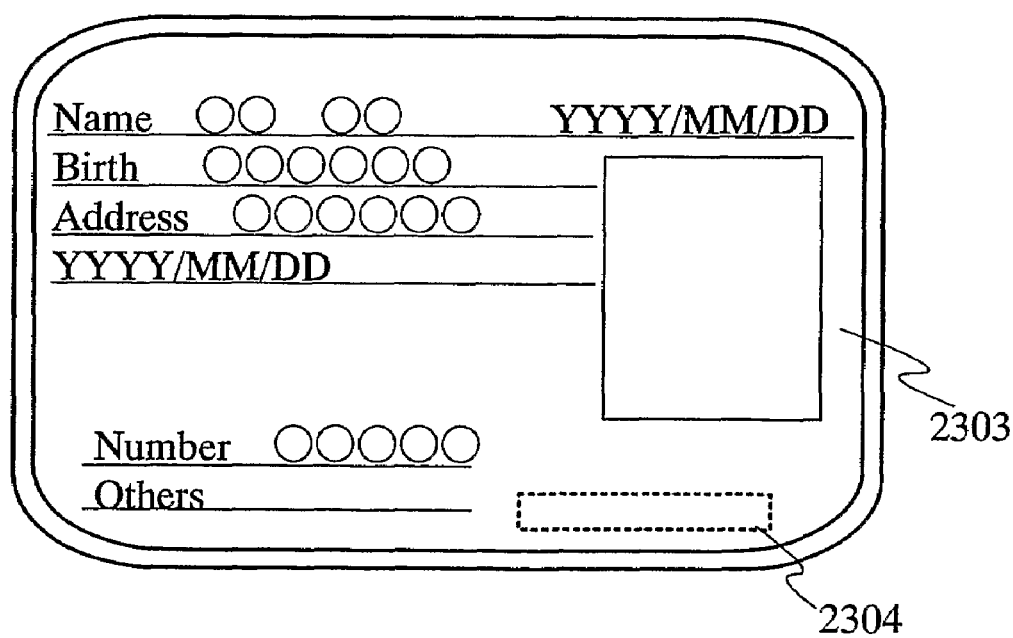

FIG. 23B shows a driving license 2303 incorporating an ID chip. In FIG. 23B, an ID chip 2304 is incorporated in the driving license 2303. Since the ID chip 2304 transmits light, it may be mounted on a printed surface of the driving license 2303. For example, the ID chip 2304 may be mounted on a printed surface of the driving license 2303 and covered with a laminate film. Alternatively, the ID chip 2304 may be sandwiched between materials of the driving license 2303 and incorporated in it.

When the ID chip is incorporated in the aforementioned objects, counterfeiting thereof can be prevented. The counterfeiting of the aforementioned bag can also be prevented by incorporating the ID chip. In addition, design of the passport, the diving license and the like can be maintained since an extremely thin and small ID chip is used. Further, the ID chip, which transmits light, can be mounted on the surface of the products.

The ID chip also facilitates the management of the passport, the driving license and the like. In addition, data can be stored in the ID chip without being written directly to the passport, the driving license and the like, resulting in privacy protection.

Figure 24:
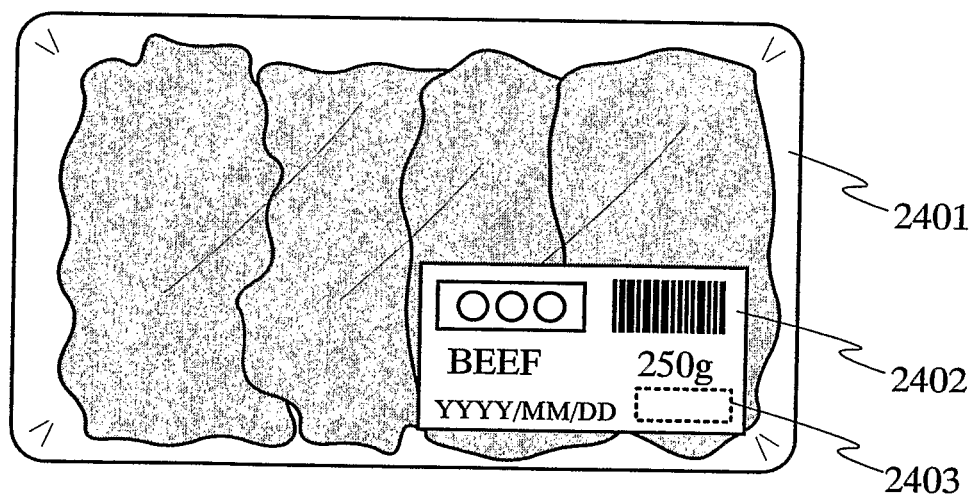
FIG. 24 is a view showing food management using the invention.

An ID chip that is incorporated in products such as food for safety control is shown in FIG. 24.

FIG. 24 shows a display label 2402 incorporating an ID chip 2403, which is attached to a pack of meat 2401. The ID chip 2403 may be mounted on the surface of or incorporated in the display label 2402. The ID chip may also be mounted on a cellophane for wrapping fresh food such as vegetables.

The ID chip 2403 can store basic data on the product such as a production area, a producer, a processing date, and a use-by date, as well as additional data such as a serving suggestion for the product. The basic data which is not required to be rewritten may be stored in a non-rewritable memory such as an MROM. Meanwhile, the additional data may be stored in a rewritable and erasable memory such as an EEPROM.

For safety control of food, it is important to obtain data on plants and animals that are not yet processed. In order to do this, an ID chip may be implanted in plants and animals and data thereon may be obtained by a reader device. The data on plants and animals includes a breeding area, a feed, a breeder, presence and absence of infection, and the like.

When the price of a product is stored in the ID chip, payment of the product can be made more simply in a shorter time than the case of a conventional bar code being used. That is, a plurality of products each incorporating the ID chip can be paid at a time. In the case of reading a plurality of ID chips, a reader device is required to be equipped with anti-collision function.

Further, depending on communication distance of the ID chip, payment of the products can be made at the cash register even when there is a distance between the products and the cash register, and shoplifting and the like can also be prevented.

The ID chip can be used in combination with other information media such as bar code and magnetic tape. For example, basic data that is not required to be rewritten may be stored in the ID chip whereas data to be rewritten such as discount price and bargain information may be stored in the bar code. The data of the bar code can be easily modified unlike that of the ID chip.

As set forth above, incorporation of the ID chip increases the amount of information given to consumers, thus they can purchase products at ease.

Figure 25A:
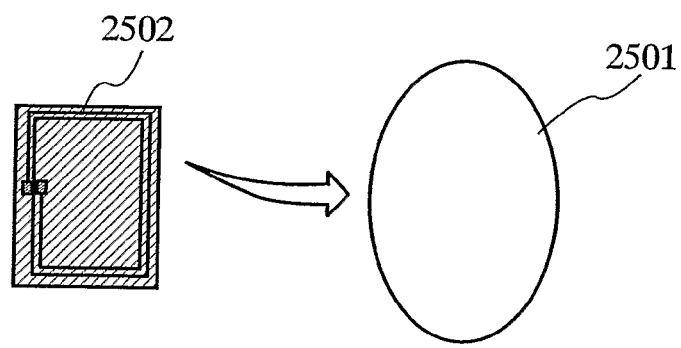
FIGS. 25A and 25B are views showing distribution management using the invention.

Described next is the case of incorporating an ID chip in products such as a beer bottle for distribution management. As shown in FIG. 25A, an ID chip 2502 is incorporated in a beer bottle using, for example, a label 2501.

Figure 25B:
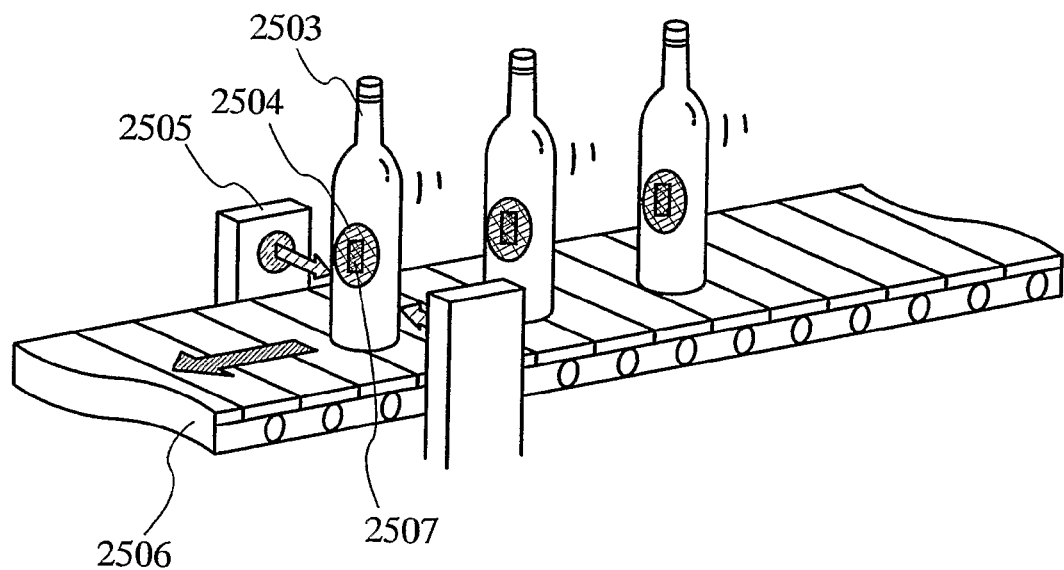

The ID chip 2502 stores basic data such as a manufacturing date, a manufacturing area and ingredients. Such basic data is not required to be rewritten, thus it may be stored in a non-rewritable memory such as an MROM. The ID chip also stores individual data of the beer bottle such as a delivery address and a delivery date. For example, as shown in FIG. 25B, when each beer bottle 2503 moving on a conveyor belt 2506 passes a writer device 2505, each delivery address and delivery date can be stored in an ID chip 2507 incorporated in a label 2504. Such individual data may be stored in a rewritable and erasable memory such as an EEPROM.

A system is preferably configured such that when data on a purchased product is transmitted from a delivery destination to a distribution management center via a network, the delivery address and date are calculated by a writer device, a personal computer for controlling the writer device, or the like, and then stored in the ID chip.

Since the bottles are delivered per case, the ID chip may be incorporated in each case or every several cases to store individual data.

When the ID chip is incorporated in such drinks that may store a plurality of delivery addresses, the time required for manual data input can be reduced, resulting in reduced input error. In addition, it is possible to lower labor costs that are the most costly expenses in the distribution management. Thus, incorporation of the ID chip allows the distribution management to be performed with few errors at low cost.

Additional data such as food to go with beer and a recipe with beer may be stored at the delivery destination. As a result, the food and the like can be promoted and consumers' willingness to buy can be increased. Such additional data may be stored in a rewritable and erasable memory such as an EEPROM. In this manner, incorporation of the ID chip increases the amount of information given to consumers, thus they can purchase products at ease.

A product incorporating an ID chip for manufacturing management is described as well as a manufacturing apparatus (manufacturing robot) controlled based on data of the ID chip.

In recent years, original products are often manufactured, and they are manufactured on a production line based on its original data. For example, in a production line of cars that can provide free color choice of doors, an ID chip is incorporated in a part of each car and a painting apparatus is controlled based on the data of the ID chip. Accordingly, an original car can be manufactured.

When the ID chip is incorporated, there is no need to control the order and color of cars to be put into a production line in advance. Therefore, it is not necessary to set a program for controlling a painting apparatus in accordance with the order and number of cars. That is, a manufacturing apparatus can operate individually based on data of the ID chip incorporated in each car.

As set forth above, the ID chip can be applied to various fields. Based on the data stored in the ID chip, individual manufacturing data can be obtained and the manufacturing apparatus can be controlled based on the individual data.

Figure 26:
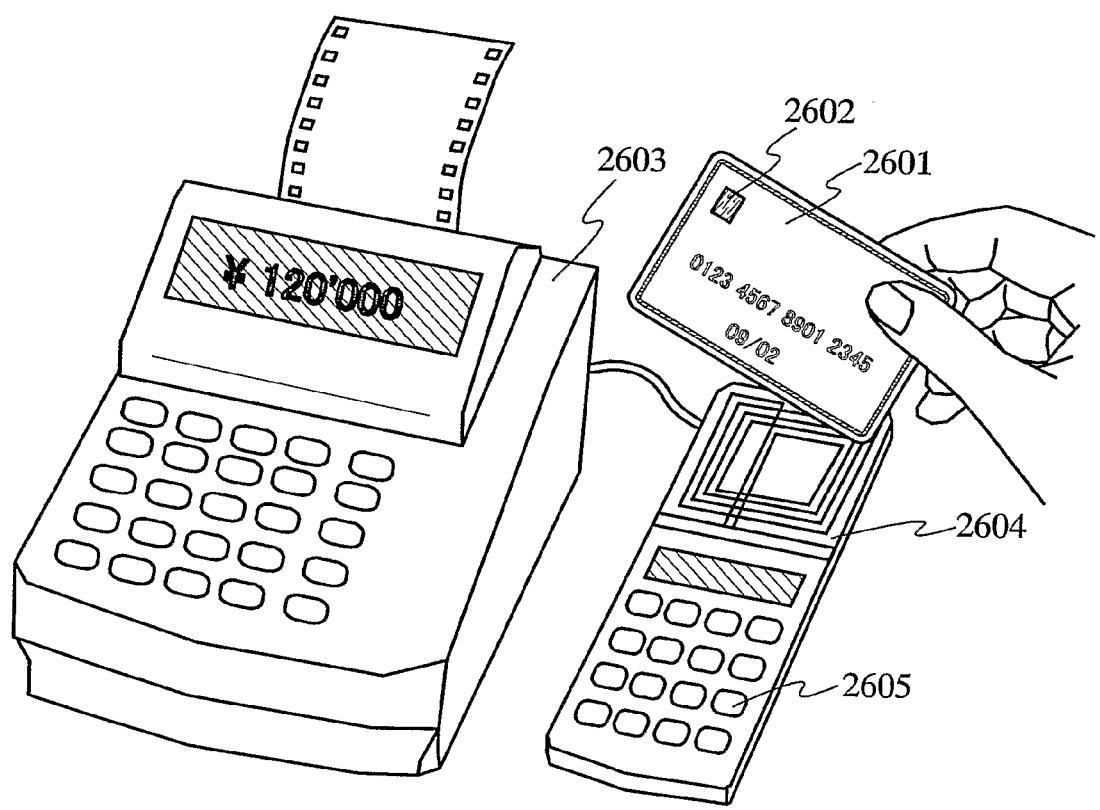
FIG. 26 is a view showing IC card payment using the invention.

Described hereinafter is an IC card incorporating the ID chip of the invention, which is used as electronic money. FIG. 26 shows an IC card 2601 that is used to make payment. The IC card 2601 incorporates an ID chip 2602 of the invention. A cash register 2603 and a reader/writer 2604 are needed for using the IC card 2601. The ID chip 2602 stores data of the amount available on the IC card 2601, and the data of the amount can be read wirelessly by the reader/writer 2604 and transmitted to the cash register 2603. The cash register 2603 verifies that the amount to be paid is available on the IC card 2601, and then payment is made. Subsequently, data of remainder of the money after the payment is transmitted to the reader/writer 2604, and written to the ID chip 2602 of the IC card 2601 by the reader/writer 2604.

The reader/writer 2604 may be equipped with a key 2605 for inputting a password and the like, thereby the IC card 2601 can be prevented from being used by a third party without notice.

The application shown in this embodiment is just an example, and the invention is not limited to this.

As set forth above, the application range of the invention is so wide that the ID chip of the invention can be applied for identification of all products. This embodiment can be implemented in combination with Embodiment Mode and Embodiments 1 to 6.

EXPLANATION OF REFERENCE 1. power supply 2. power supply 21. connecting wiring 51. wiring 53. interlayer film 54. protective film 55. protective film 56. gate electrode 57. island shape semiconductor film 58. gate insulating film 60. substrate 61. peeling layer 62. resist 63. resist 64. impurity element 65. low concentration impurity region 66. resist 67. impurity element 68. high concentration impurity region 69. N-channel TFT 70. P-channel TFT 71. N-channel TFT 72. P-channel TFT 73. CPU 74. memory 75. insulating film 76. side wall 77. resist 78. impurity element 79. high concentration impurity region 80. terminal portion 200. semiconductor device 201. antenna circuit 202. rectification circuit 203. stabilizing power supply circuit 205. modulation circuit 206. amplifier 207. logic circuit 208. amplifier 209. logic circuit 211. memory circuit 212. memory control circuit 213. demodulation circuit 301. antenna coil 302. tuning capacitor 303. diode 304. diode 305. smoothing capacitor 401. ID chip 402. antenna unit 403. interrogator 404. bag 501. concave mirror 502. convex minor 503. reticle 504. substrate 505. slit 506. light source 601. stage 602. substrate 603. optical system 604. reticle 605. optical system 606. slit 607. optical system 608. light source 701. column decoder 702. row decoder 703. TFT 704. TFT 705. TFT 706. TFT 707. word line 708. word line 709. bit line (data line) 710. bit line (data line) 711. column switch 712. column switch 713. power supply line 714. load resistor 715. amplifier 716. output terminal 717. output wiring 718. memory cell 719. memory cell 720. memory cell 721. memory cell 801. contact hole 802. contact hole 803. contact hole 804. contact hole 1000. substrate 1001. antenna 1002. circuit 1003. substrate 1004. antenna 1005. circuit 1006. substrate 1007. antenna 1008. circuit 1009. substrate 1010. antenna 1011. circuit 1012. substrate 1013. antenna 1014. circuit 1100. substrate (upper substrate) 1101. antenna (antenna wiring) 1600. IC card 1601. circuit portion 1610. ID tag 1611. circuit portion 1620. product 1621. protective film 1622. ID chip 1630. housing 1631. in chip 1640. shipping tag 1641. ID chip 1650. book 1651. protective film 1652. ID chip 1660. bill 1661. ID chip 1670. shoe 1671. protective film 1672. ID chip 1801. protective film 1802. ID chip 1803. protective film 1804. antenna 2201. bag 2202. ID chip 2301. passport 2302. ID chip 2303. driving license 2304. ID chip 2401. pack 2402. label 2403. ID chip 2501. label 2502. JD chip 2503. beer bottle 2504. label 2505. writer device 2506. conveyor belt 2507. ID chip 2601. IC card 2602. ID chip 2603. cash register 2604. reader/writer 2605. key 3000. insulating substrate 3001. base film 3002. base film 3003. island shape semiconductor layer 3004. island shape semiconductor layer 3005. island shape semiconductor layer 3006. gate insulating film 3007. conductive layer 3008. conductive layer 3009. conductive layer 3011. conductive layer 3012. conductive layer 3013. conductive layer 3016. impurity region 3017. impurity region 3018. impurity region 3019. impurity region 3020. side wall 3021. side wall 3022. impurity region 3023. impurity region 3024. interlayer insulating film 3025. interlayer insulating film 3026. electrode 3027. electrode 3028. electrode 3029. electrode 3030. electrode 3031. contact 3032. contact 3033. contact 4000. peeling layer 4001. interlayer insulating film 4002. pad 4003. pad 4004. pad 4005. pad 4006. protective film 4007. groove 4008. adhesive 4009. support base

The invention claimed is:

1. A manufacturing method of a semiconductor device comprising:

forming a plurality of circuit portions each having a modulation circuit, a demodulation circuit, and a logic circuit over an insulating substrate by using a first exposure means having any one of a mirror projection exposure system, a step and repeat exposure system and a step and scan exposure system; and forming a plurality of different memory circuits over the substrate by using a second exposure means capable of changing an exposure pattern depending on program.

2. A manufacturing method of a semiconductor device comprising:

forming an object to be processed over an insulating substrate;

applying a photoresist on the object;

exposing the photoresist by a first exposure means having any one of a mirror projection exposure system, a step and repeat exposure system and a step and scan exposure system;

exposing the photoresist by a second exposure means capable of changing an exposure pattern depending on program;

developing the photoresist exposed by the first exposure means and the second exposure means; and etching the object by using the developed photoresist to form a plurality of first patterns of circuit portions each having a modulation circuit, a demodulation circuit, and a logic circuit and a plurality of second patterns of different memory circuits.

3. A manufacturing method of a semiconductor device comprising:

forming an object to be processed over an insulating substrate;

applying a first photoresist on the object;

exposing the first photoresist by a first exposure means having any one of a mirror projection exposure system, a step and repeat exposure system and a step and scan exposure system;

developing the exposed first photoresist;

etching the object by using the developed first photoresist to form a plurality of first patterns of circuit portions each having a modulation circuit, a demodulation circuit, and a logic circuit;

applying a second photoresist on the object;

exposing the second photoresist by a second exposure means capable of changing an exposure pattern depending on program;

developing the exposed second photoresist; and etching the object by using the developed second photoresist to form a plurality of second patterns of different memory circuits.

4. A manufacturing method of a semiconductor device comprising:

forming an object to be processed over an insulating substrate;

applying a photoresist on the object;

exposing the photoresist by a first exposure means having any one of a mirror projection exposure system, a step and repeat exposure system and a step and scan exposure system;

exposing the photoresist by a second exposure means capable of changing an exposure pattern depending on program;

developing the photoresist exposed by the first exposure means and the second exposure means; and etching the object by using the developed photoresist to form a plurality of first patterns of first circuit portions and a plurality of second patterns of different second circuit portion.

5. A manufacturing method of a semiconductor device comprising:

forming an object to be processed over an insulating substrate;

applying a photoresist on the object;

exposing the photoresist by a first exposure means having any one of a mirror projection exposure system, a step and repeat exposure system and a step and scan exposure system;

exposing the photoresist by a second exposure means capable of changing an exposure pattern depending on program;

developing the photoresist exposed by the first exposure means and the second exposure means; and etching the object by using the developed photoresist to form a plurality of first patterns of first circuit portions and a plurality of second patterns of different second circuit portions, wherein different data is stored in each of the second circuit portions.

6. The manufacturing method of a semiconductor device according to any one of claims 1 to 3, wherein the memory circuit is a mask ROM.

7. The manufacturing method of a semiconductor device according to claim 4 or 5, wherein the second circuit portion is a mask ROM.

8. The manufacturing method of a semiconductor device according to any one of claims 1 to 3, wherein the difference among the plurality of memory circuits is data stored therein.

9. The manufacturing method of a semiconductor device according to claim 4, wherein the difference among the plurality of second circuit portions is data stored therein.

10. The manufacturing method of a semiconductor device according to any one of claims 1 to 5, wherein the second exposure means is an exposure means using an electron beam exposure system.

11. The manufacturing method of a semiconductor device according to any one of claims 1 to 5, wherein the second exposure means is an exposure means using a laser exposure system.

12. The manufacturing method of a semiconductor device according to any one of claims 1 to 5, wherein a portion exposed by the second exposure means is a contact hole.

13. The manufacturing method of a semiconductor device according to any one of claims 1 to 5, wherein the insulating substrate is one selected from the group consisting of a glass substrate, a plastic substrate, and a film insulator.

14. The manufacturing method of a semiconductor device according to claim 4 or 5, wherein each of the first circuit portions comprises a modulation circuit, a demodulation circuit, and a logic circuit.

15. The manufacturing method of a semiconductor device according to claim 4 or 5, wherein each of the second circuit portions comprises different memory circuits.

* * * * *